United States Patent
Wu et al.

(10) Patent No.: US 9,985,009 B2
(45) Date of Patent: May 29, 2018

(54) MANUFACTURING METHOD OF LED LIGHT EMITTING DEVICE

(71) Applicant: UNITY OPTO TECHNOLOGY CO., LTD., New Taipei (TW)

(72) Inventors: Ching-Huei Wu, New Taipei (TW); Chih-Hsien Wu, New Taipei (TW); Wei Chang, New Taipei (TW); Huan-Ying Lu, New Taipei (TW); Shih-Chao Shen, New Taipei (TW)

(73) Assignee: UNITY OPTO TECHNOLOGY CO., LTD., New Taipei (TW)

(*) Notice: Subject to any disclaimer, the term of this patent is extended or adjusted under 35 U.S.C. 154(b) by 0 days. days.

(21) Appl. No.: 15/216,983

(22) Filed: Jul. 22, 2016

(65) Prior Publication Data

US 2017/0148775 A1 May 25, 2017

Related U.S. Application Data

(60) Provisional application No. 62/258,619, filed on Nov. 23, 2015.

(51) Int. Cl.
| | |
|---|---|
| *H01L 29/20* | (2006.01) |
| *H01L 33/00* | (2010.01) |
| *H01L 25/13* | (2006.01) |
| *H01L 33/50* | (2010.01) |

(52) U.S. Cl.
CPC ............ *H01L 25/13* (2013.01); *H01L 33/504* (2013.01); *H01L 2933/0041* (2013.01)

(58) Field of Classification Search
CPC ................... H01L 25/13; H01L 33/504; H01L 2933/0041
See application file for complete search history.

(56) References Cited

U.S. PATENT DOCUMENTS

| | | | | |
|---|---|---|---|---|
| 2011/0316025 | A1* | 12/2011 | Kuzuhara | H01L 33/504 257/98 |
| 2015/0034980 | A1* | 2/2015 | Windisch | H01L 27/15 257/89 |

(Continued)

OTHER PUBLICATIONS

Hunter Lab, Equivalent White Light Sources and CIE Illuminants, May 2008, vol. 17, No. 5.*

(Continued)

*Primary Examiner* — Ismail Muse
(74) *Attorney, Agent, or Firm* — Rosenberg, Klein & Lee

(57) ABSTRACT

Disclosed are an LED light emitting device and its manufacturing method. A blue LED chip specification is selected, a green phosphor and the blue LED chip are used to determine a green light frame on the CIE1931 chromaticity coordinates and a red phosphor together with a blue LED chip are used to determine a red light frame on the CIE1931 chromaticity coordinates, and a predetermined straight line passing through the color temperature target frame is selected, and both end points of the predetermined straight line fall within the green light frame and the red light frame, so as to determine the concentration of the green phosphor and the red phosphor, and the green and red phosphors and a blue LED chip are packaged to form a first LED and a second LED, and at least one first LED and at least one second LED are installed on a substrate.

3 Claims, 17 Drawing Sheets

(56) References Cited

U.S. PATENT DOCUMENTS

2016/0062023 A1\* 3/2016 Itoh ..................... G02B 6/0068
362/608
2016/0079211 A1\* 3/2016 Konishi .............. H01L 25/0753
438/27

OTHER PUBLICATIONS

Yam, WOLEDs and Organic Photovoltaics, Nov. 19, 2010, p. 82.\*
Danny Pascale, A review of RGB color spaces, 2002/2003, p. 15.\*
Cypress Semiconductor, Tunable White Light, Nov. 2010, p. 3.\*

\* cited by examiner

```
┌─────────────────────────────────────────┐
│    Select a blue LED chip specification │──── S101
└─────────────────────────────────────────┘
                    │
┌─────────────────────────────────────────┐
│ Use a green phosphor together with the blue LED │
│ chip to determine a green light frame defined by the │──── S102
│ CIE1931 chromaticity coordinates │
└─────────────────────────────────────────┘
                    │
┌─────────────────────────────────────────┐
│ Use a red phosphor together with the blue LED chip to │
│ determine a red light frame defined by the CIE1931 │──── S103
│ chromaticity coordinates │
└─────────────────────────────────────────┘
                    │
┌─────────────────────────────────────────┐
│ Select a predetermined straight line passing through the │
│ color temperature target frame, wherein both end points │
│ of the predetermined straight line fall in the green light │
│ frame and the red light frame respectively, so that the │
│ concentration of the green phosphor and the red │
│ phosphor can be determined, and the green phosphor │──── S104
│ together with the blue LED chip are packaged into an │
│ integrally formed first LED, and the red phosphor │
│ together with the blue LED chip are packaged into an │
│ integrally formed second LED, and finally install at │
│ least one the first LED and at least one the second LED │
│ are installed to a substrate │
└─────────────────────────────────────────┘
                    │
┌─────────────────────────────────────────┐
│ Change the quantity of the first LEDs and the quantity │
│ of the second LED to adjust a brightness ratio of the │
│ first LED to the second LED when the predetermined │
│ straight line passes through the color temperature target │──── S105
│ frame to form two points of intersection, so that the │
│ overall color temperature of the LED light emitting │
│ device oscillates in the predetermined straight line │
│ within the color temperature target frame │
└─────────────────────────────────────────┘
```

Fig. 6

MANUFACTURING METHOD OF LED LIGHT EMITTING DEVICE

CROSS-REFERENCE TO RELATED APPLICATIONS

This non-provisional application claims priority under 35 U.S.C. § 119(e) on Patent Application No(s). 62/258,619 filed in the United States on Nov. 23, 2015, the entire contents of which are hereby incorporated by reference.

BACKGROUND OF THE INVENTION

1. Field of the Invention

The present invention relates to the field of a light emitting diode (LED), and more particularly to an LED light emitting device manufacturing method and an LED light emitting device capable of adjusting color temperature easily.

2. Description of the Related Art

Cone cells of human eyes may be divided into three different photoreceptors according to light-absorbing pigments receiving the primary colors (red, green and blue) of a visible spectrum respectively, and colors are defined and described by these cone cells. To standardize the colors sensed by human eyes, COMMISSION INTERNATIONALE DE L'ECLAIRAGE, CIE) established in 1931 has created CIE1931 color spaces to simplify the simulation value XYX of the three primary colors and obtain a CIE1931 xy chromaticity diagram, which are common standard coordinates. In other words, if the CIE1931 xy chromaticity coordinates of a certain color are obtained, then color characters can be defined specifically in chromaticity. For example, the independent standards of white light must be defined in the field of illumination, and Planck's blackbody radiation is one of them. When the spectrum of a certain light source is the same as the spectrum of the blackbody radiation, the absolute temperature parameter of the surface of the blackbody may be used to define the color and spectrum of the light, so as to express light color by color temperature, know the color temperature and the chromaticity coordinates of the light source, and confirm the color characteristics of the light source.

Light emitting diode (LED) is a very popular light source for illumination lamps and generally emits a light with a narrow spectral range, so that a single LED can just emits a light with a fixed color tone, and the color mixing principle is used to select an LED light source for a lamp with the required color temperature. When an illumination lamp requires a specific color temperature, the lamp adopts white light LEDs with a single color temperature or different color temperatures to form a cold or warm color illumination light source. In design and manufacture, the lamp is intuitively designed with a white light source or each LED light source disposed on the lamp base is designed with a white light source in order to avoid the light mixing action that follows and non-uniform color temperature of the light produced the mixed light, and the light color of the white light LED is adjusted by mixing the primary colors (RGB) of the LED chip (RGB) or by mixing and supplementing the color light of the phosphor and the LED chip. With reference to FIG. 1, at least one blue light LED chip 20, a red phosphor 21 and a green phosphor 22a are used to package and form a white light LED 2, and the white light LED 2 adjusts the condition of the red phosphor 21 and the green phosphor 22 to form a specific light source according to the required color temperature, wherein the red phosphor 21 and the green phosphor 22 as shown in FIG. 1 are provided for illustrating the present invention wherein they are packaged into the white light LED 2 but not in the form of phosphor. And then, at least one the white light LED 2 is installed to a circuit board 3 to form a conventional light emitting device 4 according to the required elements such as brightness. The conventional light emitting device 4 may be applied as a main light source for lamps such as bulbs. With reference to FIGS. 2A-2D for different configurations of the conventional light emitting device 4 respectively, we can observe that the method of adjusting the concentration of the phosphors is very inconvenient, because the color temperature of a light varies with a change of concentration of any phosphor. When the proportion and concentration of the phosphors are changed, and the result after the change cannot be simulated in advance, so that it is necessary to measure the related data every time after the white light LED 2 is packaged, and thus increasing the level of difficult of product development and design significantly.

In view of the aforementioned problems of the prior art, the inventor of the present invention based on years of experience in the related industry to conduct extensive researches and experiments and finally designed a manufacturing method of a LED light emitting device capable of adjusting the color temperature easily and developed an LED light emitting device in accordance with the present invention to overcome the problems of the prior art.

SUMMARY OF THE INVENTION

Therefore, it is a primary objective of the present invention to provide a manufacturing method of an LED light emitting device capable of adjusting the color temperature easily and LED light emitting device, wherein the lights of different color LEDs are mixed to form a light emitting device in compliance with a required color temperature and having the features of high degree of freedom for dimming, high light emission efficiency and accurate color temperature.

To achieve the aforementioned and other objectives, the present invention provides a manufacturing method of an LED light emitting device capable of adjusting the color temperature easily for expressing at least one color temperature within a color temperature target frame and in compliance with the CIE1931 chromaticity coordinates specified by ANSI, comprising the steps of: selecting a blue LED chip specification; using a green phosphor and the blue LED chip to determine a green light frame from the CIE1931 chromaticity coordinates; using a red phosphor and the blue LED chip to determine a red light frame from the CIE1931 chromaticity coordinates; and selecting a predetermined straight line passing through the color temperature target frame, and both end points of the predetermined straight line falling within the green light frame and the red light frame, so as to determine the concentration of the green phosphor and the red phosphor concentration; wherein the green phosphor and the blue LED chip are packaged into an integrally formed first LED, and the red phosphor and the blue LED chip are packaged into an integrally formed second LED, and at least one first LED and at least one second LED are installed on a substrate. Therefore, the predetermined straight line passing through the color temperature target frame is used as a reference and the end points of the predetermined straight line falling in the green light frame and the red light frame are used to determined the concentration of the green phosphor and the red phosphor, so as to provide a very high degree of freedom for adjustment during the design and manufacture of the first LED and the second LED. After the LEDs are installed onto the substrate, the overall color temperature of the LED light emitting device matches the color temperature target frame. In the meantime, the LED light emitting device provides high light emission efficiency.

Wherein, the manufacturing method further comprises the step of using the quantity of the first LEDs and the quantity of second LEDs to adjust a brightness ratio of the first LED to the second LED when the predetermined straight line passes through the color temperature target frame to form two points of intersection, so that the overall color temperature of the LED light emitting device oscillates in the predetermined straight line in the color temperature target frame. Therefore, the brightness ratio of the first LED to the second LED may be adjusted according to the quantity of the first LEDs and the second LEDs provided that the selected predetermined straight line forms two points of intersection in the color temperature target frame, so as to fine tune the overall color temperature of the LED light emitting device to match the target color temperature frame by changing the brightness ratio.

Preferably, the blue LED chip has a wavelength of 400 nm-480 nm, and the red phosphor emits a red light wavelength of 600 nm-650 nm after being excited, and the green phosphor emits a green light wavelength of 515 nm-560 nm after being excited.

In addition, when the target color temperature of the LED light emitting device is ANSI2700K-3000K, the color temperature target frame has a range defined by the CIE1931 chromaticity coordinates (0.481,0.431), (0.459,0.394), (0.430,0.417) and (0.415,0.382); the green light frame has a range defined by the CIE1931 chromaticity coordinates (0.44,0.50), (0.44,0.55), (0.26,0.62), (0.27,0.40) and (0.39, 0.45); and the red light frame has a range defined by the CIE1931 chromaticity coordinates (0.52,0.35), (0.56,0.39), (0.64,0.30), (0.47,0.16) and (0.46,0.32).

Further, the overall color temperature of the LED light emitting device falls in the color temperature target frame, and the brightness ratio of the first LED to the second LED is maintained to be 1.2-2.0 and the color temperature of the LED light emitting device may be fine-tuned, so that the color temperature oscillates in the predetermined straight line to provide an LED light emitting device with a high degree of freedom for deployment and improve the optical quality of the LED light emitting device.

When the target color temperature of the LED light emitting device is ANSI4100K, the color temperature target frame has a range defined by the CIE1931 chromaticity coordinates (0.400,0.403), (0.374,0.388), (0.367,0.358) and (0.390,0.371); the green light frame has a range defined by the CIE1931 chromaticity coordinates (0.37,0.42), (0.40, 0.45), (0.38,0.60), (0.35,0.64), (0.33,0.65), (0.24,0.55) and (0.26,0.32); and the red light frame has a range defined by the CIE1931 chromaticity coordinates (0.54,0.26), (0.53, 0.18), (0.37,0.15), (0.33,0.29) and (0.50,0.40).

Further, the brightness ratio of the first LED to the second LED is set to 2.2-3.2, so that the overall color temperature of the LED light emitting device can be fine tuned and the LED light emitting device complies with the color temperature target frame.

When the target color temperature of the LED light emitting device is ANSI5000K, the color temperature target frame has a range defined by the CIE1931 chromaticity coordinates (0.355,0.375), (0.338,0.362), (0.337,0.337) and (0.351,0.348); the green light frame has a range defined by the CIE1931 chromaticity coordinates (0.37,0.42), (0.40, 0.45), (0.38,0.60), (0.35,0.64), (0.33,0.65), (0.24,0.55) and (0.26,0.32); and the red light frame has a range defined by the CIE1931 chromaticity coordinates (0.54,0.26), (0.53, 0.18), (0.37,0.15), (0.33,0.29) and (0.50,0.40).

Further, the brightness ratio of the first LED to the second LED is set to 3.6-4.2, and the color temperature of the LED light emitting device is fine tune, while the color temperature of the LED light emitting device is maintained to fall in the color temperature target frame.

When the target color temperature of the LED light emitting device is ANSI6500K, the color temperature target frame has a range defined by the CIE1931 chromaticity coordinates (0.321,0.348), (0.303,0.331), (0.307,0.312) and (0.322,0.325); the green light frame has a range defined by the CIE1931 chromaticity coordinates (0.37,0.42), (0.30, 0.60), (0.28,0.60), (0.27,0.47), (0.24,0.32) and (0.285,0.34); and the red light frame has a range defined by the CIE1931 chromaticity coordinates (0.37,0.32), (0.45,0.18), (0.29, 0.08), (0.28,0.20) and (0.30,0.27).

In addition, when the brightness ratio of the first LED to the second LED is 3.6-4.2, the color temperature of the LED light emitting device will oscillate in the predetermined straight line and situate in the color temperature target frame, and the brightness ratio of the first LED to the second LED is used to adjust the overall color temperature of the LED light emitting device.

The present invention further discloses an LED light emitting device in compliance with a color temperature in at least one color temperature target frame defined by CIE1931 chromaticity coordinates, comprising: a substrate; at least one first LED, installed to the substrate, and including a first blue LED chip and a green phosphor, and the green phosphor absorbing a blue light emitted from the first blue LED chip and being excited to produce a green light; and at least one second LED, installed to the substrate, and including a second blue LED chip and a red phosphor, and the red phosphor absorbing a blue light emitted from the second blue LED chip and being excited to produce a red light; wherein, the first blue LED chip and the second blue LED chip have the same specification, and the green light of the first LED and the red light of the second LED are two end points of a predetermined straight line passing through the color temperature target frame defined by the CIE1931 chromaticity coordinates. Therefore, the overall color temperature of the LED light emitting device can fall in the color temperature target frame, and both ends points of the predetermined straight line passing through the color temperature target frame are a point with the green light chromaticity coordinates of the first LED and a point with the red light chromaticity coordinates of the second LED respectively, so as to provide an LED light emitting device capable of adjusting color temperature easily.

Wherein, the quantity of the first LEDs and the quantity of the second LEDs are used to adjust a brightness ratio of the first LED to the second LED when the predetermined straight line and the color temperature target frame form two points of intersection, so that the overall color temperature of the LED light emitting device oscillates on the predetermined straight line in the color temperature target frame. In the LED light emitting device, the brightness ratio may be adjusted by changing the quantity of the first LEDs and the quantity of the second LEDs, so that the color temperature of the LED light emitting device falls in the color temperature target frame, and the expression of color temperature may be fine tuned to further improve the degree of freedom of adjusting the LED light emitting device and the optical quality of the expression of color temperature.

Preferably, the first blue LED chip and the second blue LED chip have a wavelength of 400 nm-480 nm, and the red phosphor after being excited has a red light wavelength of 600 nm-650 nm, and the green phosphor after being excited has a green light wavelength of 515 nm-560 nm.

When the target color temperature of the LED light emitting device is ANSI2700K-3000K, the color temperature target frame has a range defined by the CIE1931 chromaticity coordinates (0.481,0.431), (0.459,0.394), (0.430,0.417) and (0.415,0.382); the green light of the first LED falls in a green light frame defined by the CIE1931 chromaticity coordinates (0.44,0.50), (0.44,0.55), (0.26, 0.62), (0.27,0.40) and (0.39,0.45); and the red light of the second LED falls in a red light frame defined by the CIE1931 chromaticity coordinates (0.52,0.35), (0.56,0.39), (0.64,0.30), (0.47,0.16) and (0.46,0.32).

When the brightness ratio of the first LED to the second LED is 1.2-2.0, the color temperature of the LED light emitting device falls onto the predetermined straight line in the color temperature target frame to further fine tune the color temperature of the LED light emitting device to provide a higher degree of freedom for adjustment and better optical quality.

When the target color temperature of the LED light emitting device is ANSI4100K, the color temperature target frame has a range defined by the CIE1931 chromaticity coordinates (0.400,0.403), (0.374,0.388), (0.367,0.358) and (0.390,0.371); the green light of the first LED falls in a green light frame defined by the CIE1931 chromaticity coordinates (0.37,0.42), (0.40,0.45), (0.38,0.60), (0.35,0.64), (0.33, 0.65), (0.24,0.55) and (0.26,0.32); the red light of the second LED falls in a red light frame defined by the CIE1931 chromaticity coordinates (0.54,0.26), (0.53,0.18), (0.37, 0.15), (0.33,0.29) and (0.50,0.40).

When the brightness ratio of the first LED to the second LED is 2.2-3.2, the color temperature of the LED light emitting device falls onto the predetermined straight line in the color temperature target frame to further fine tune the color temperature of the LED light emitting device to provide a higher degree of freedom for adjustment and better optical quality.

When the target color temperature of the LED light emitting device is ANSI5000K, the color temperature target frame has a range defined by the CIE1931 chromaticity coordinates (0.355,0.375), (0.338,0.362), (0.337,0.337) and (0.351,0.348); the green light of the first LED falls in a green light frame defined by the CIE1931 chromaticity coordinates (0.37,0.42), (0.40,0.45), (0.38,0.60), (0.35,0.64), (0.33, 0.65), (0.24,0.55) and (0.26,0.32); the red light of the second LED falls in a red light frame defined by the CIE1931 chromaticity coordinates (0.54,0.26), (0.53,0.18), (0.37, 0.15), (0.33,0.29) and (0.50,0.40).

When the brightness ratio of the first LED to the second LED is 3.6-4.2, the color temperature of the LED light emitting device falls onto the predetermined straight line in the color temperature target frame to further fine tune the color temperature of the LED light emitting device to provide a higher degree of freedom for adjustment and better optical quality.

When the target color temperature of the LED light emitting device is ANSI6500K, the color temperature target frame has a range defined by the CIE1931 chromaticity coordinates (0.321,0.348), (0.303,0.331), (0.307,0.312) and (0.322,0.325); the green light of the first LED falls in a green light frame defined by the CIE1931 chromaticity coordinates (0.37,0.42), (0.30,0.60), (0.28,0.60), (0.27,0.47), (0.24,0.32) and (0.285,0.34); and the red light of the second LED falls in a red light frame defined by the CIE1931 chromaticity coordinates (0.37,0.32), (0.45,0.18), (0.29,0.08), (0.28,0.20) and (0.30,0.27).

When the brightness ratio of the first LED to the second LED is 3.6-4.2, the color temperature of the LED light emitting device falls onto the predetermined straight line in the color temperature target frame to further fine tune the color temperature of the LED light emitting device to provide a higher degree of freedom for adjustment and better optical quality.

In summation of the description above, the LED light emitting device and manufacturing method of the LED light emitting device capable of adjusting color temperature easily in accordance with the present invention keeps the color temperature of the LED light emitting device within a color temperature target frame by the method of mixing different colors, and its overall expression shows a uniform white light, not just providing a higher degree of freedom for dimming only, but also improving the light emission efficiency. In addition, the brightness ratio of the first LED to the second LED may be adjusted by the quantity of the first LEDs and the second LEDs, so as to fine tune the color temperature of the LED light emitting device and improving the overall optical quality the while maintaining the color temperature of the LED light emitting device within the color temperature target frame.

BRIEF DESCRIPTION OF THE DRAWINGS

FIG. 6 is a flow chart of a manufacturing method in accordance with another embodiment of the present invention;

DESCRIPTION OF THE PREFERRED EMBODIMENTS

As described above, the design and manufacture of a single white LED light source are inconvenient, and thus the inventor of the present invention breaks through the conventional design concept and provides a method of manufacturing LED light emitting devices by using LEDs of different color lights and mixing the color lights to form the required color temperature of the white light. At first, the inventor of the present invention thinks of mixing two LEDs to form a white light. In this design, white light from a lamp is formed by mixing light of an independent LED chip with light of a LED having phosphor. For example, a red LED chip can be used as a red light source, and a blue LED chip packaged with a green phosphor can be used as a green light source, and both LED chips are installed and mixed to form a color temperature of the white light. However, the color temperature of the red light is fixed after the red independent LED chip is selected. And if it is necessary to make adjustment to cope with a different color temperature, one needs to make changes in the green phosphor of the other LED. However, in this color mixing method, the red light can only be linearly fined before packaging, and thus the degree of freedom for adjustment is very limited. To comply with the required color temperature, the adjustment for the green light portion takes much time, and the scope of adjusting the color temperature is limited. Based on the concept of mixing different color lights, the inventor of the present invention invented an LED light emitting device manufacturing method and an LED light emitting device in accordance with the present invention.

Figure 3:
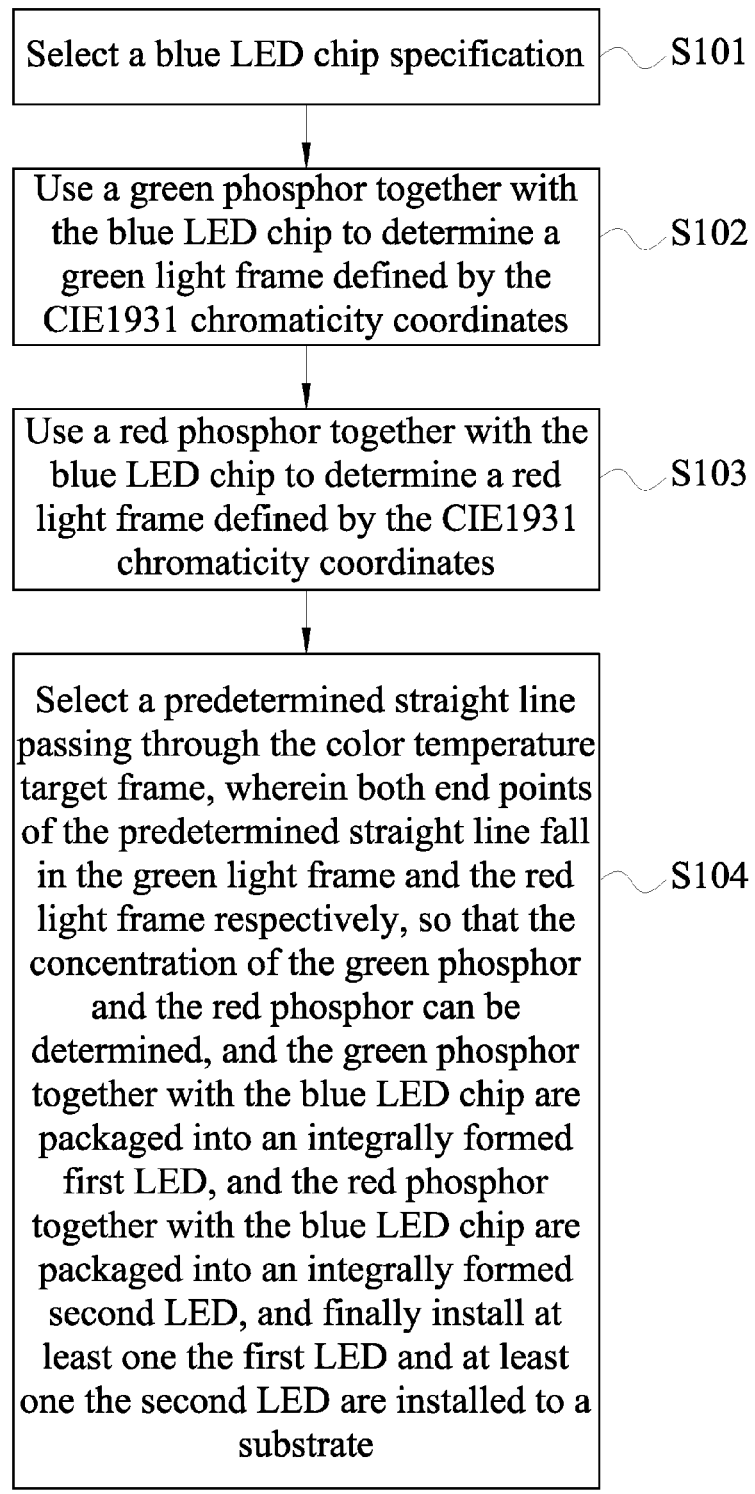
FIG. 3 is a flow chart of a manufacturing method in accordance with an embodiment of the present invention.

With reference to FIG. 3 for a flow chart of a manufacturing method of an LED light emitting device capable of adjusting the color temperature easily in accordance with an embodiment of the present invention and provided for expressing a color temperature within at least one chromaticity target frame and in compliance with the CIE1931 chromaticity coordinates specified by the ANSI, the method comprises the following steps.

S101: Select a blue LED chip specification. S102: Use a green phosphor and the blue LED chip to determine a green light frame defined by CIE1931 chromaticity coordinates. S103: Use a red phosphor and the blue LED chip to determine a red light frame defined by CIE1931 chromaticity coordinates. In this step, the type of blue LED chip is selected to meet the requirements of the type and composition of the green phosphor and the red phosphor. After the blue LED chip is selected, the green light frame and the red light frame defined by the CIE1931 chromaticity coordinates can be determined to facilitate the adjustment taken place later.

S104: Select a predetermined straight line passing through the color temperature target frame, wherein the end points of the predetermined straight line fall in the green light frame and the red light frame respectively, so that the concentration of the green phosphor and the red phosphor can be determined, and the green phosphor, together with the blue LED chip, are packaged into an integrally formed first LED, and the red phosphor, together with the blue LED chip, are packaged into an integrally formed second LED, and finally install at least one first LED and at least one second LED are installed to a substrate. The concentrations of the green phosphor and the red phosphor can be determined by the two end points of the predetermined straight line. After the concentrations of the green phosphor and the red phosphor are confirmed and the first LED and the second LED are packaged and formed, the color lights of the first LED and the second LED are mixed to express a color temperature in the color temperature target frame and provide a more accurate and quicker LED light emitting device manufacturing method.

Figure 4:
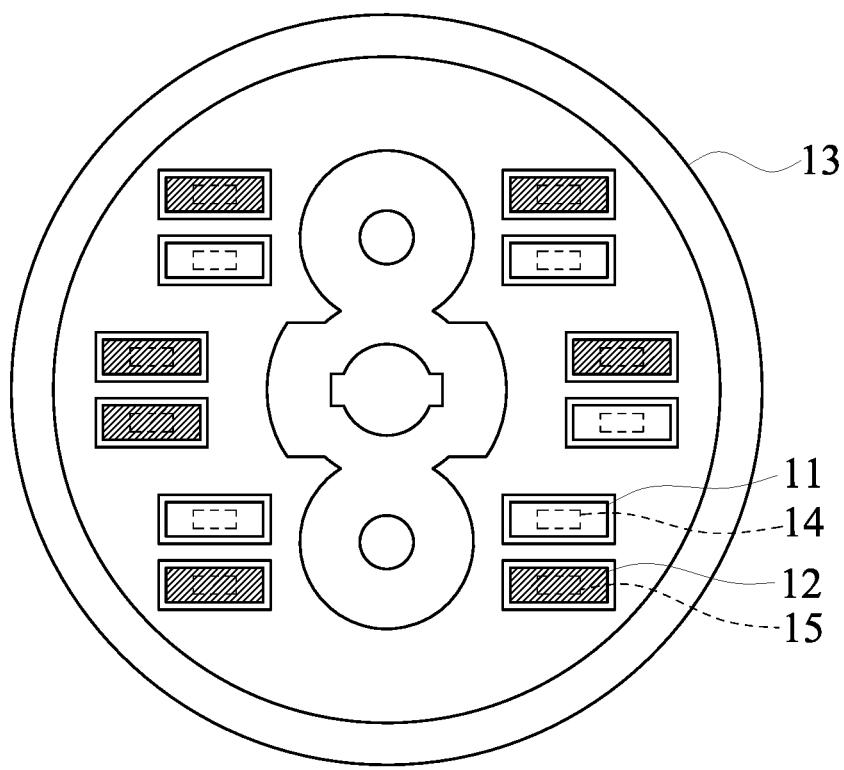
FIG. 4 is a planar schematic view of an LED light emitting device in accordance with an embodiment of the present invention.

With reference to FIG. 4 for a schematic planar view of an LED light emitting device in accordance with an embodiment of the present invention, the present invention further discloses an LED light emitting device 1 with a color temperature in at least one color temperature target frame in compliance with the color temperature in compliance with the CIE1931 chromaticity coordinates, the LED light emitting device 1 comprises: a substrate 13, at least one first LED 11, and at least one second LED 12. The first LED 11 is installed to the substrate 13 and includes a first blue LED chip 14 and a green phosphor, and the green phosphor absorbs a blue light emitted by the first blue LED chip 14 and is excited to produce a green light. The second LED 12 is installed to the substrate 13 and includes a second blue LED chip 15 and a red phosphor, and the red phosphor absorbs a blue light emitted by the second blue light LED chip 15 and is excited to produce a red light. Wherein, the first blue LED chip 14 and the second blue LED chip 15 have the same specification, and the green light of the first LED 11 and the red light of the second LED 12 are corresponsive to two end points of the predetermined straight line passing through the color temperature target frame defined by the CIE1931 chromaticity coordinates.

With reference to FIGS. 5A-5L and FIGS. 1 and 2A-2D as well, the first LED 11 and the second LED 12 are installed to the substrate 13 to form the LED light emitting device 1. Compared with the prior art, the present invention not just has an excellent degree of freedom for dimming only, but also packages a blue light LED chip 20 together with a red phosphor 21 and a green phosphor 22 to form a white light LED 2 with high light emission efficiency. The comparison of efficiencies between the conventional light emitting device 4 formed by installing the white light LED 2 to the circuit board and the LED light emitting device 1 in the same color temperature is given below. To make it easier to describe, we use the following tables of the conventional light emitting device 4 and the LED light emitting device 1 of the present invention accompanied with FIGS. 2A-2D and 5A-5L for the comparison.

The conventional light emitting device 4 having the circuit board 3 installed with a single white light LED 2 and the LED light emitting device 1 having the substrate 13 installed with a single first LED 11 and a single second LED 12 are measured and compared under the condition of the same color temperature as shown in Table 1 (Comparison of Efficiencies), and the white light LED 2 has two blue light LED chips 20. Refer to the figures listed in the following tables for the configurations of the conventional light emitting device 4 and the LED light emitting device 1 respectively. In Table 1 (Comparison of Efficiencies), the present invention achieves a better efficiency in the condition of the same color temperature.

TABLE 1

Comparison of Efficiencies

Figure 1:
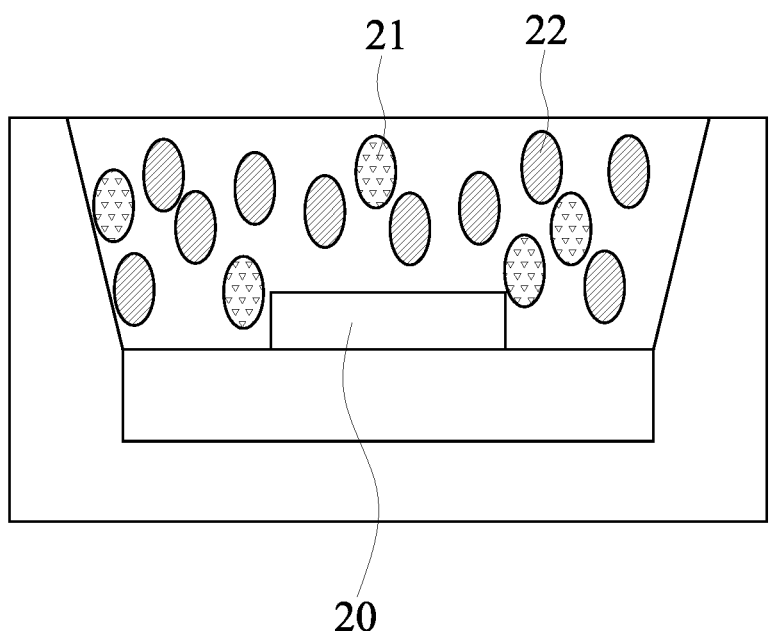
FIG. 1 is a schematic view of a conventional white light LED.
Figure 2A:
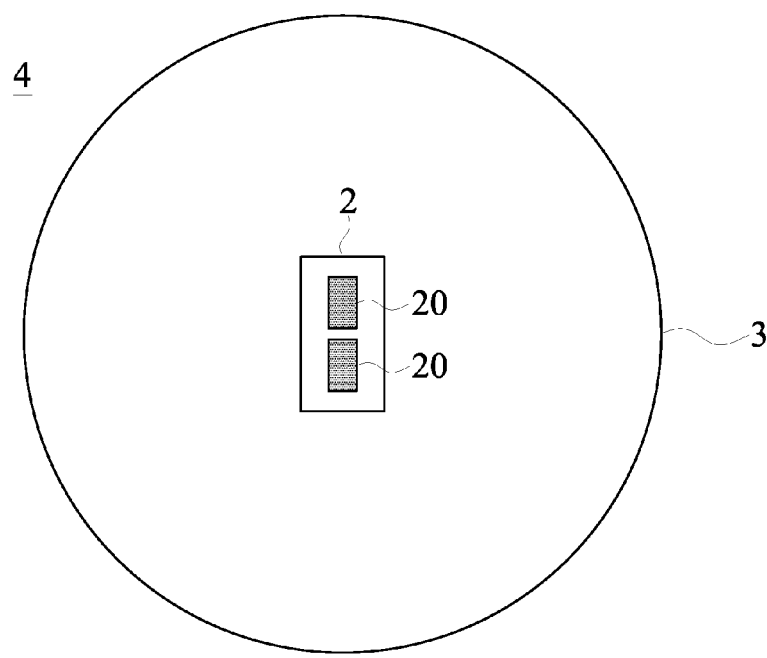
FIG. 2A shows a first configuration of a conventional light emitting device.
Figure 5A:
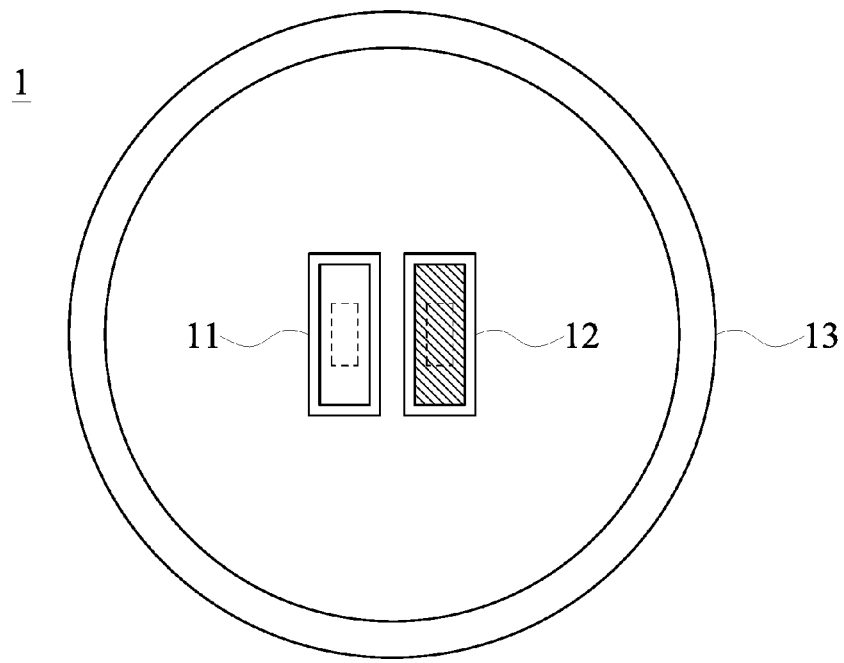
FIG. 5A shows a first configuration of an LED light emitting device of the present invention.

| Conventional light emitting device | Efficiency (lm/W) | The present invention | Efficiency (lm/W) | Color temperature (K) |
| --- | --- | --- | --- | --- |
| FIG. 2A | 129 | FIG. 5A | 148 | 3289 |

The conventional light emitting device 4 having the circuit board 3 installed with two white light LEDs 2 and the LED light emitting device 1 having the substrate 13 installed with a single first LED 11 and a single second LED 12 are measured and compared under the condition of same color temperature as shown in Table 2 (Comparison of Efficiencies), and each white LED 2 is packaged with a corresponsive single blue light LED chip 20. Refer to the figures listed in the following tables for the configurations of the conventional light emitting device 4 and the LED light emitting device 1 respectively. Table 2 (Comparison of Efficiencies) shows that the present invention achieves a better efficiency in the condition of same color temperature.

TABLE 2

Comparison of Efficiencies

Figure 2B:
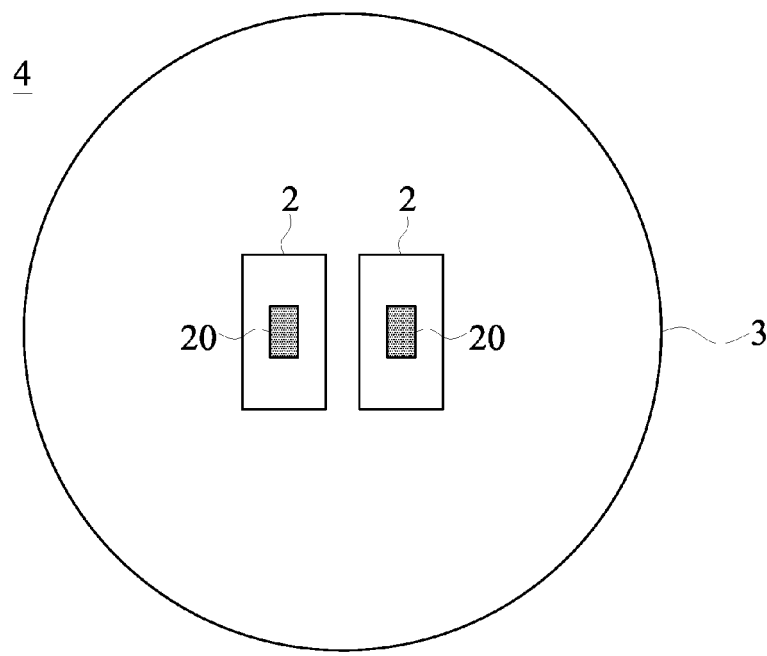
FIG. 2B shows a second configuration of a conventional light emitting device.

| Conventional light emitting device | Efficiency (lm/W) | The present invention | Efficiency (lm/W) | Color temperature (K) |
| --- | --- | --- | --- | --- |
| FIG. 2B | 133 | FIG. 5A | 148 | 3289 |

With reference to Tables 3-5 for the comparison of efficiencies, the conventional light emitting device 4 having the circuit board 3 installed with two white light LEDs 2 and the LED light emitting device 1 having the substrate 13 installed with two first LEDs 11 and one second LED 12 are measured and compared under the condition of the same color temperature, and one of the white lights LED 2 is packaged with two blue light LED chips 20, and the other white light LED 2 is packaged with one blue light LED chip 20. Refer to the figures listed in the following tables for the configurations of the conventional light emitting device 4 and the LED light emitting device 1 respectively.

TABLE 3

Comparison of Efficiencies

Figure 2C:
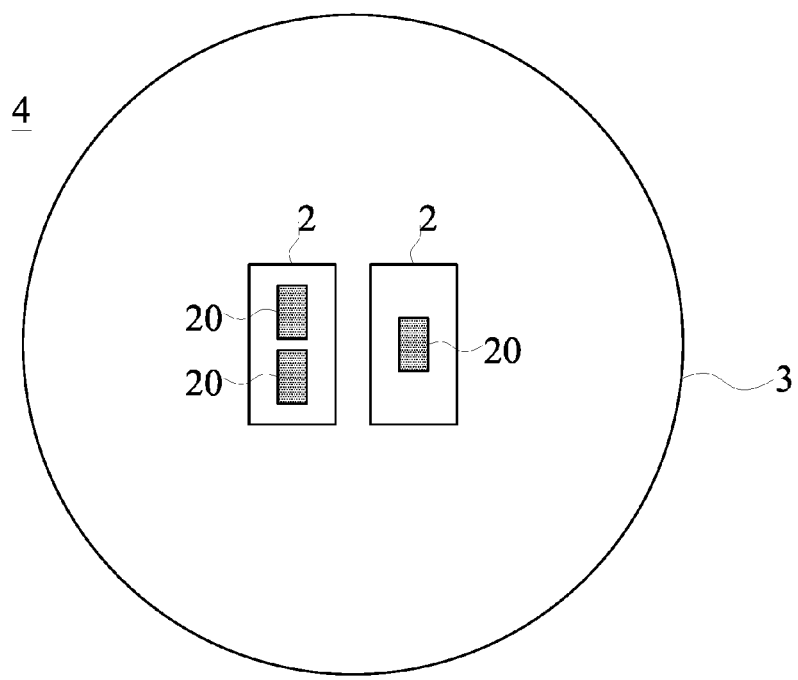
FIG. 2C shows a third configuration of a conventional light emitting device.
Figure 5B:
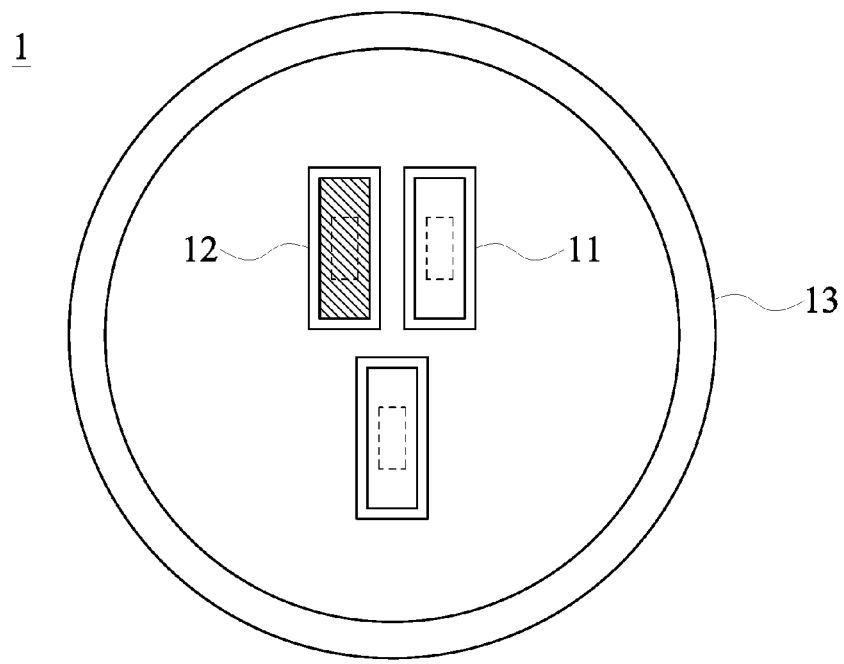
FIG. 5B shows a second configuration of an LED light emitting device of the present invention.

| Conventional light emitting device | Efficiency (lm/W) | The present invention | Efficiency (lm/W) | Color temperature (K) |
| --- | --- | --- | --- | --- |
| FIG. 2C | 141 | FIG. 5B | 162 | 4037 |

TABLE 4

Comparison of Efficiencies

Figure 5C:
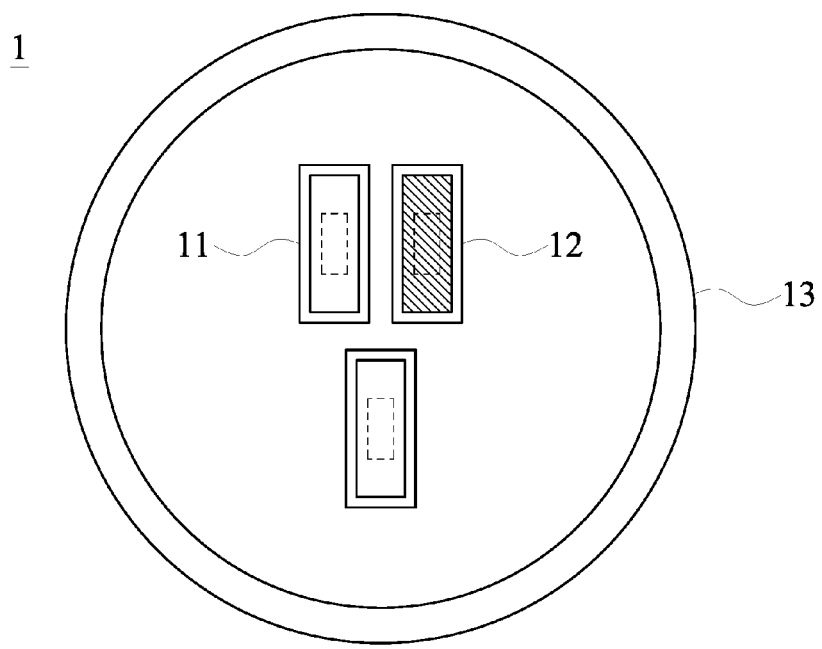
FIG. 5C shows a third configuration of an LED light emitting device of the present invention.

| Conventional light emitting device | Efficiency (lm/W) | The present invention | Efficiency (lm/W) | Color temperature (K) |
| --- | --- | --- | --- | --- |
| FIG. 2C | 141 | FIG. 5C | 162 | 4037 |

TABLE 5

Comparison of Efficiencies

Figure 5D:
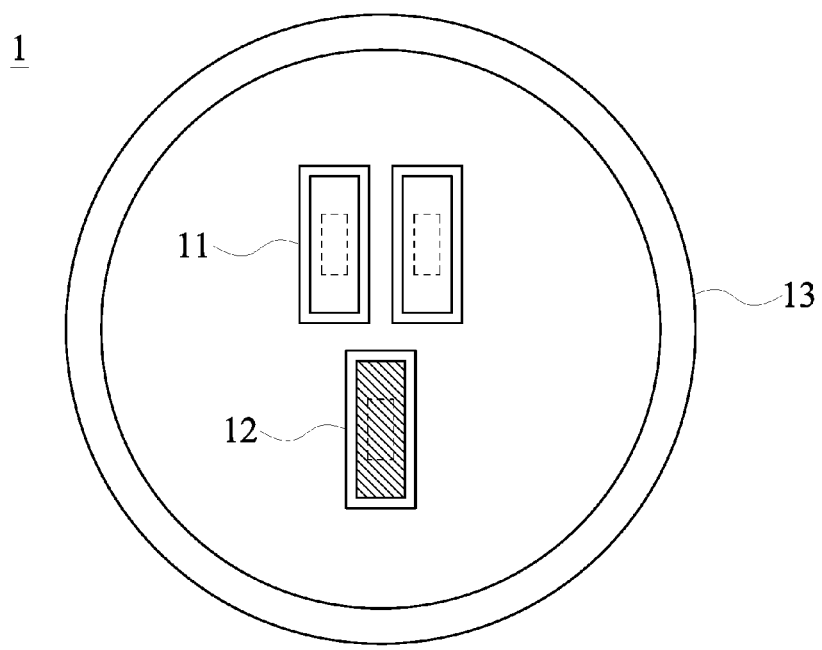
FIG. 5D shows a fourth configuration of an LED light emitting device of the present invention.

| Conventional light emitting device | Efficiency (lm/W) | The present invention | Efficiency (lm/W) | Color temperature (K) |
| --- | --- | --- | --- | --- |
| FIG. 2C | 141 | FIG. 5D | 162 | 4037 |

In summation of Tables 3 to 5 (Comparison of Efficiencies Table 3), the light emitting device of the present invention has a better light emission efficiency than the conventional light emitting device 4 under the same color temperature, regardless of the arrangement and positions of the first LEDs 11 and the second LEDs 12 on the substrate 13.

In Table 6-9 (Comparison of Efficiencies), the conventional light emitting device 4 having the circuit board 3 installed with two white light LEDs 2 and the LED light emitting device 1 having the substrate 13 installed with two first LEDs 11 and two second LEDs 12 are measured and compared under the condition of the same color temperature, and each white light LED 2 is packaged with two blue light LED chips 20. Refer to the figures listed in the following tables for the configurations of the conventional light emitting device 4 and the LED light emitting device 1 respectively.

TABLE 6

Comparison of Efficiencies

Figure 2D:
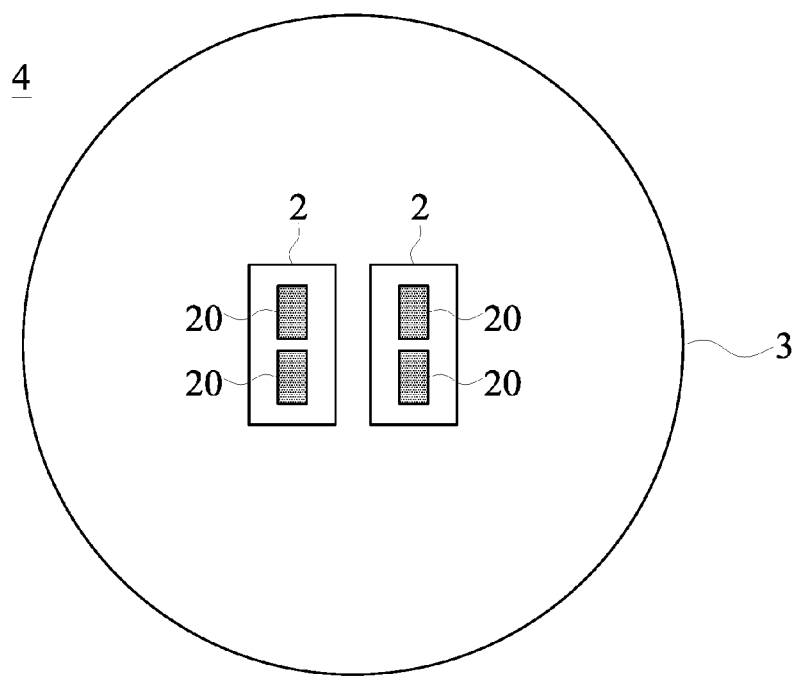
FIG. 2D shows a fourth configuration of a conventional light emitting device.
Figure 5E:
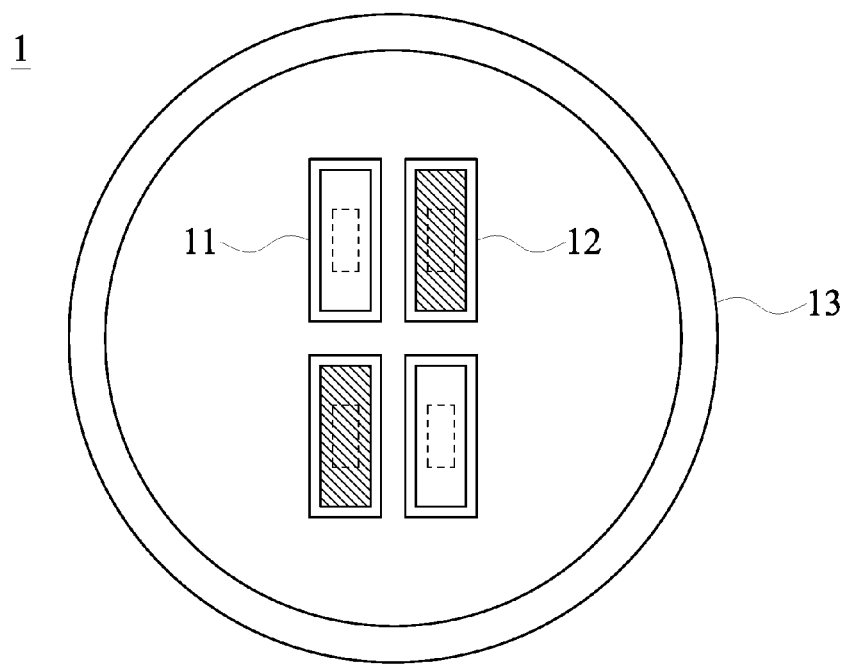
FIG. 5E shows a fifth configuration of an LED light emitting device of the present invention.

| Conventional white light LED | Efficiency (lm/W) | The present invention | Efficiency (lm/W) | Color temperature (K) |
| --- | --- | --- | --- | --- |
| FIG. 2D | 129 | FIG. 5E | 148 | 3289 |

TABLE 7

Comparison of Efficiencies

Figure 5F:
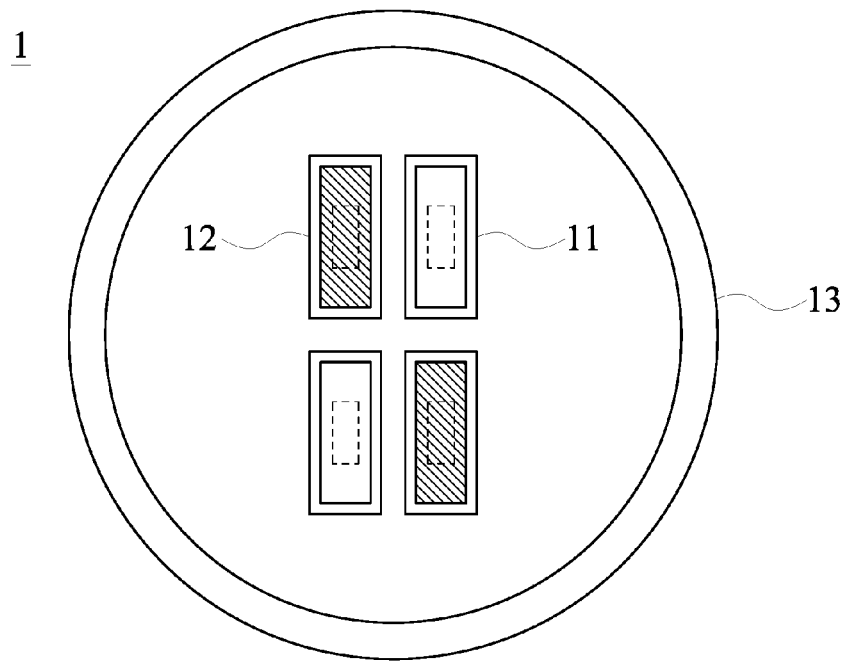
FIG. 5F shows a sixth configuration of an LED light emitting device of the present invention.

| Conventional white light LED | Efficiency (lm/W) | The present invention | Efficiency (lm/W) | Color temperature (K) |
| --- | --- | --- | --- | --- |
| FIG. 2D | 129 | FIG. 5F | 148 | 3289 |

TABLE 8

Comparison of Efficiencies

Figure 5G:
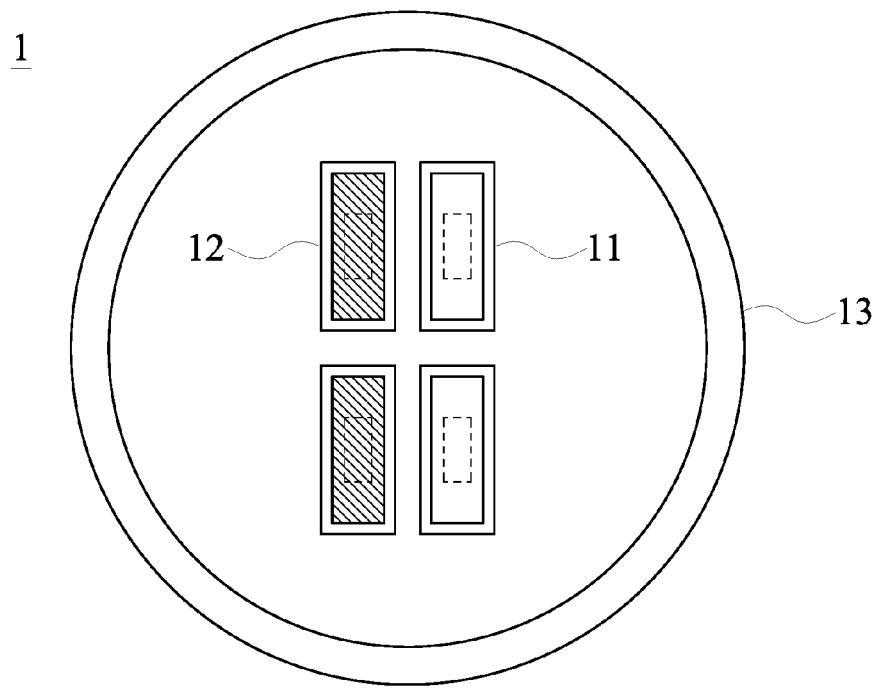
FIG. 5G shows a seventh configuration of an LED light emitting device of the present invention.

| Conventional white light LED | Efficiency (lm/W) | The present invention | Efficiency (lm/W) | Color temperature (K) |
| --- | --- | --- | --- | --- |
| FIG. 2D | 129 | FIG. 5G | 148 | 3289 |

TABLE 9

Comparison of Efficiencies

Figure 5H:
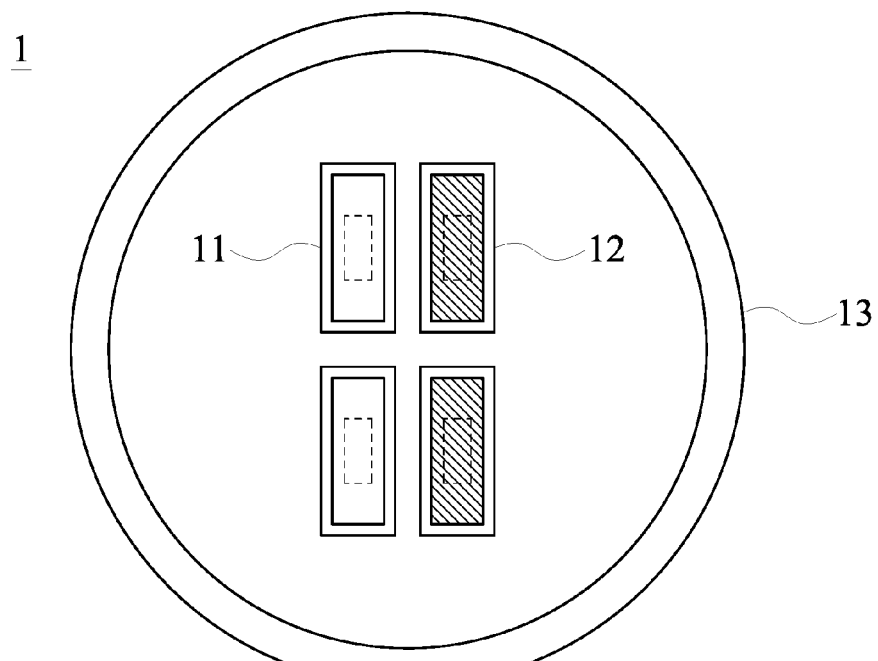
FIG. 5H shows an eighth configuration of an LED light emitting device of the present invention.

| Conventional white light LED | Efficiency (lm/W) | The present invention | Efficiency (lm/W) | Color temperature (K) |
|---|---|---|---|---|
| FIG. 2D | 129 | FIG. 5H | 148 | 3289 |

In summation of Tables 6 to 9 (Comparison of Efficiencies), the light emitting device of the present invention has a better light emission efficiency than the conventional light emitting device 4 under same color temperature, regardless of the arrangement and positions of the first LEDs 11 and the second LEDs 12 on the substrate 13.

In Tables 10-13 (Comparison of Efficiencies), the conventional light emitting device having the circuit board installed with two white light LEDs 2 and the LED light emitting device having the substrate installed with one first LED 11 and three second LEDs 12 are measured and compared under the condition of same color temperature, and each white light LED 2 is packaged with two blue light LED chips 20. Refer to the figures listed in the following tables for the configurations of the conventional light emitting device 4 and the LED light emitting device 1 respectively.

TABLE 10

Comparison of Efficiencies

Figure 5I:
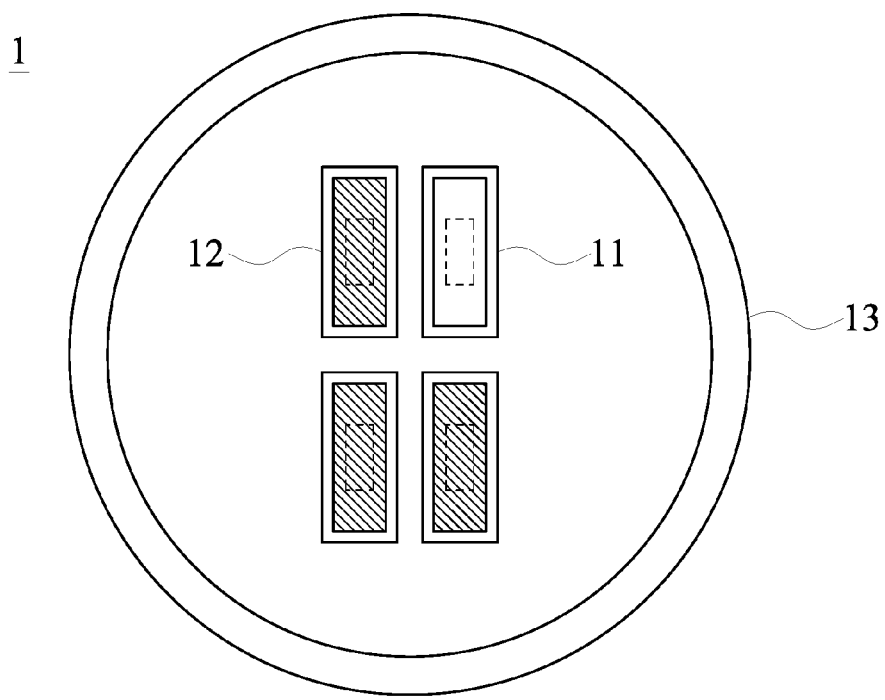
FIG. 5I shows a ninth configuration of an LED light emitting device of the present invention.

| Conventional white light LED | Efficiency (lm/W) | The present invention | Efficiency (lm/W) | Color temperature (K) |
|---|---|---|---|---|
| FIG. 2D | 89 | FIG. 5I | 105 | 2067 |

TABLE 11

Comparison of Efficiencies

Figure 5J:
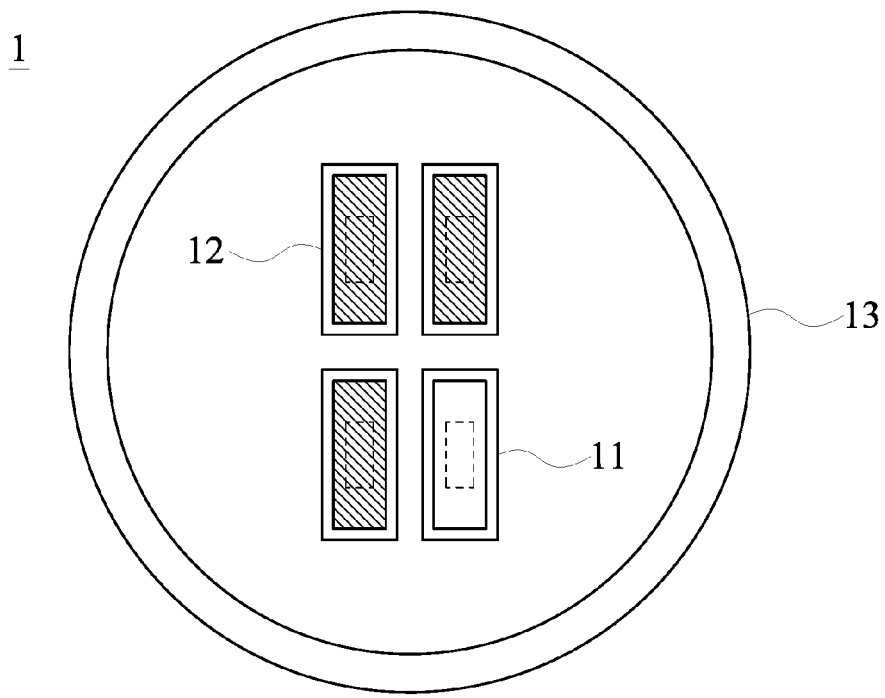
FIG. 5J shows a tenth configuration of an LED light emitting device of the present invention.

| Conventional white light LED | Efficiency (lm/W) | The present invention | Efficiency (lm/W) | Color temperature (K) |
|---|---|---|---|---|
| FIG. 2D | 89 | FIG. 5J | 105 | 2067 |

TABLE 12

Comparison of Efficiencies

Figure 5K:
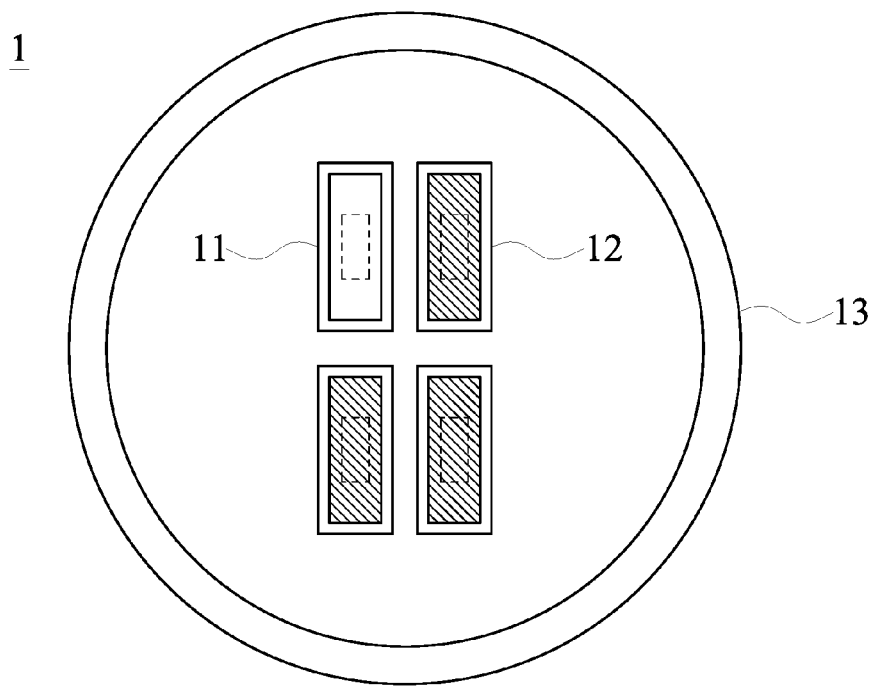
FIG. 5K shows an eleventh configuration of an LED light emitting device of the present invention.

| Conventional white light LED | Efficiency (lm/W) | The present invention | Efficiency (lm/W) | Color temperature (K) |
|---|---|---|---|---|
| FIG. 2D | 89 | FIG. 5K | 105 | 2067 |

TABLE 13

Comparison of Efficiencies

Figure 5L:
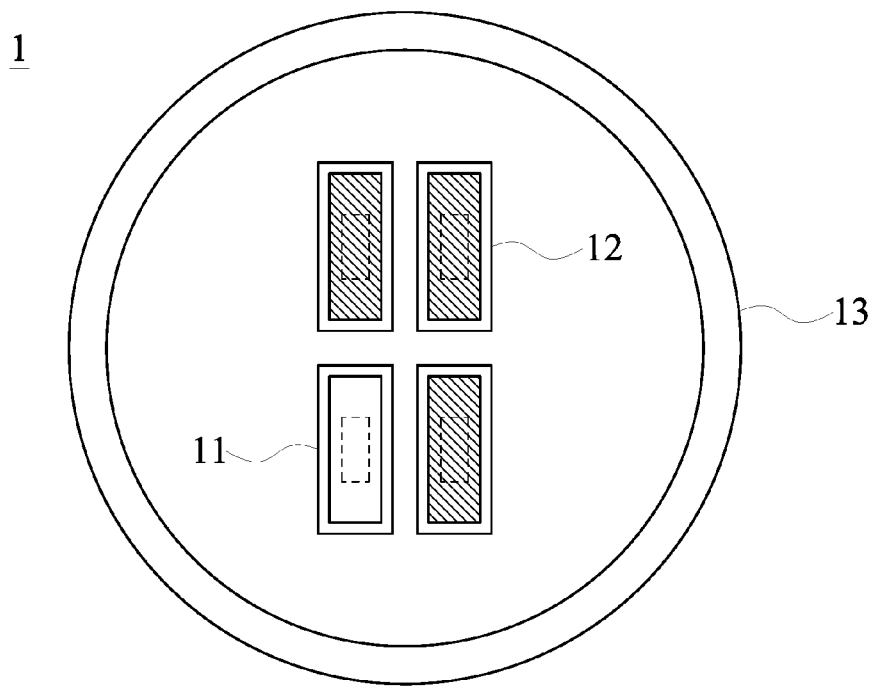
FIG. 5L shows a twelfth configuration of an LED light emitting device of the present invention.

| Conventional white light LED | Efficiency (lm/W) | The present invention | Efficiency (lm/W) | Color temperature (K) |
|---|---|---|---|---|
| FIG. 2D | 89 | FIG. 5L | 105 | 2067 |

In summation of Tables 10 to 13 (Comparison of Efficiencies), the light emitting device of the present invention has a better light emission efficiency than the conventional light emitting device 4 under the same color temperature, regardless of the arrangement and positions of the first LEDs 11 and the second LEDs 12 on the substrate 13.

In the aforementioned tables (Comparison of Efficiencies), the LED light emitting device 1 of the present invention has better light emission efficiency than the conventional light emitting device 4.

With reference to FIG. 6 for a flow chart of a manufacturing method in accordance with another embodiment of the present invention another, the manufacturing method of an LED light emitting device capable of adjusting the color temperature easily further comprises the following step (S105) to improve the color temperature of the LED light emitting device. When the predetermined straight line passes through the color temperature target frame to form two points of intersection, the quantity of the first LEDs and the quantity of the second LED may be changed to adjust a brightness ratio of the first LED to the second LED, so that the overall color temperature of the LED light emitting device oscillates in the predetermined straight line within the color temperature target frame. S105: Determine the concentration of the green phosphor and the red phosphor according to the end points of the predetermined straight line, and package and form the first LED and the second LED, and further change the quantity of the first LEDs and the second LEDs to adjust the brightness ratio of the two, so that the color temperature of the LED light emitting device (except those already falling in the color temperature target frame) complies with the color temperature target frame and the condition of situating at the predetermined straight line. A better optical quality can be achieved by the method of changing the brightness ratio and fine tuning the color temperature of the LED light emitting device. In this embodiment, the blue LED chip has a wavelength of 400 nm-480 nm, the red phosphor after being excited has a red light wavelength of 600 nm-650 nm, and the green phosphor after being excited has a green light wavelength of 515 nm-560 nm. However, the present invention is not limited to the above arrangement only.

Similarly, when the predetermined straight line of the LED light emitting device 1 and the color temperature target frame form two points of intersection as shown in FIG. 3, the quantity of the first LED 11 and the quantity of the second LED 12 are set to adjust a brightness ratio of the first LED 11 to the second LED 12, so that the overall color temperature of the LED light emitting device 1 oscillates in the predetermined straight line within the color temperature target frame, so that the color temperature of the LED light emitting device 1 is fine tuned. In addition, both of the first blue LED chip 14 and the second blue LED chip 15 have a wavelength of 400 nm-480 nm, and the red phosphor after being excited has a red light wavelength of 600 nm-650 nm, and the green phosphor after being excited has a green light wavelength of 515 nm-560 nm, but the present invention is not limited to the above arrangement only.

When the target color temperature of the LED light emitting device 1 is ANSI2700K-3000K, 4100K-5000K and 6500K, the color temperature target frame, the green light frame of the first LED 11, the red light frame of the second LED 12 and the predetermined straight line are expressed by the CIE1931 chromaticity coordinates, and the overall color temperature of the LED light emitting device 1 in different brightness ratios is expressed by the CIE1931 chromaticity coordinates.

Figure 7:
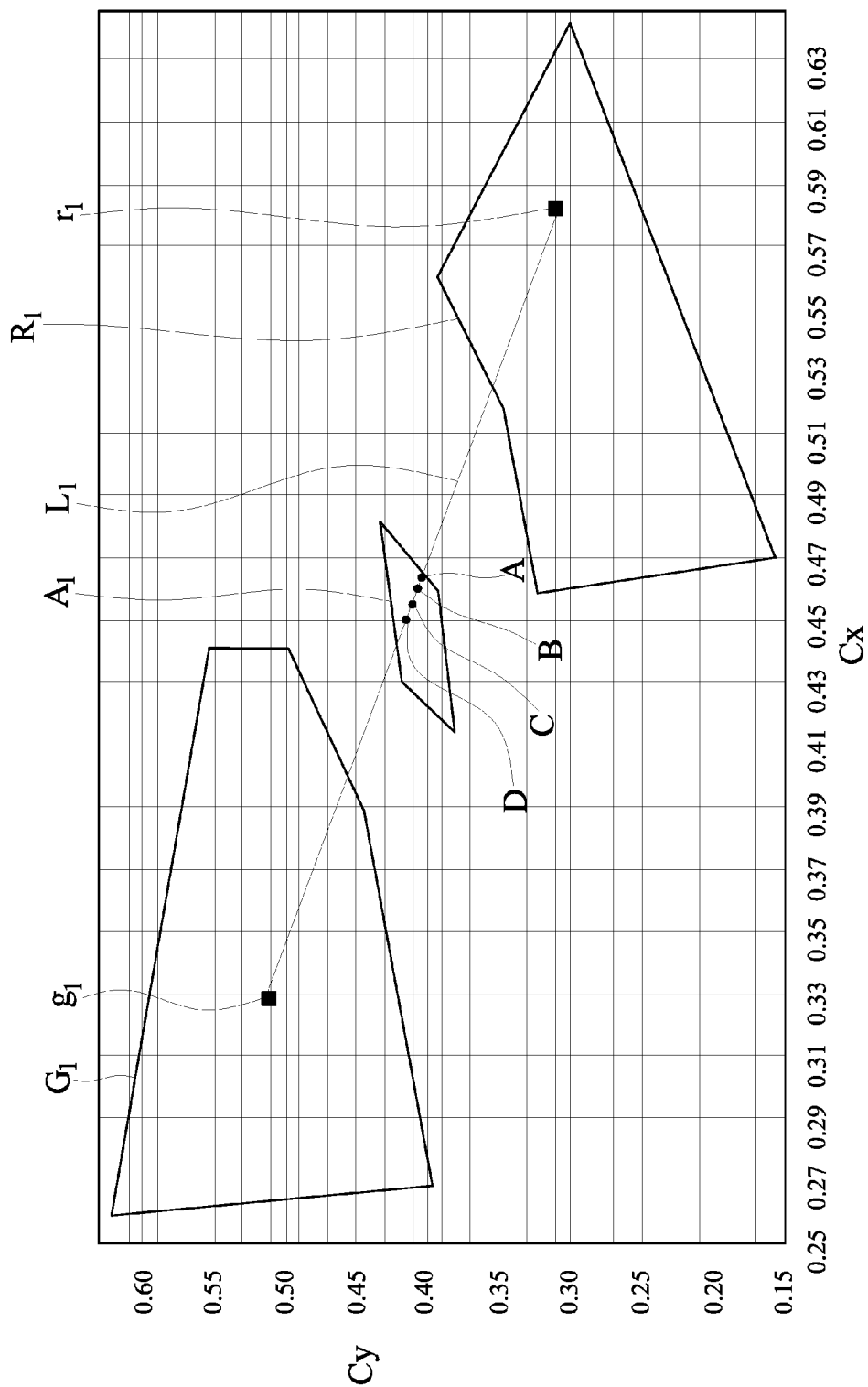
FIG. 7 shows the CIE1931 chromaticity coordinates of a first implementation mode of the present invention.

With reference to FIG. 7 for the CIE1931 chromaticity coordinates in accordance with the first implementation mode of the present invention, ANSI2700K refers to the color temperature falling within a range of 2580K-2870K, and ANSI3000K refers to the color temperature falling within a range of 2870K-3220K, so that the specification of ANSI2700K-3000K generally refers to the color temperature falling within a range of 2580K-3220K. When the target color temperature of the LED light emitting device 1 is ANSI2700K-3000K, the color temperature target frame $A_1$ has a range defined by the CIE1931 chromaticity coordinates (0.481,0.431), (0.459,0.394), (0.430,0.417) and (0.415,0.382), and the green light frame $G_1$ has a range defined by the CIE1931 chromaticity coordinates of (0.44, 0.50), (0.44,0.55), (0.26,0.62), (0.27,0.40) and (0.39,0.45), and the red light frame $R_1$ has a range defined by the CIE1931 chromaticity coordinates of (0.52,0.35), (0.56, 0.39), (0.64,0.30), (0.47,0.16) and (0.46,0.32). The end point $g_1$ of the predetermined straight line $L_1$ corresponsive to the green light frame $G_1$ has the coordinates of (0.328, 0.511), and the end point $r_1$ of the red light frame $R_1$ has the coordinates of (0.582, 0.310), and the brightness ratio of the first LED 11 to the second LED 12 falls within a range of 1.2-2.0, and measurements are made under the aforementioned conditions, and the measured results are listed in Table 1.

TABLE 1

| Co-ordinate point | First LED brightness (lm) | Second LED brightness (lm) | Brightness ratio | Color temperature (K) | CIE1931 chromaticity coordinates |
|---|---|---|---|---|---|
| A | 120 | 100 | 1.2 | 2586 | (0.465, 0.405) |
| B | 150 | 100 | 1.5 | 2671 | (0.461, 0.406) |
| C | 170 | 100 | 1.7 | 2757 | (0.456, 0.409) |
| D | 200 | 100 | 2.0 | 2859 | (0.452, 0.413) |

In Table 1, the measurements show that the overall color temperature of the LED light emitting device 1 forms four coordinate points A-D as listed in Table 1 under different brightness ratios, and A-D are disposed on the predetermined straight line $L_1$ in the color temperature target frame $A_1$, and the overall color temperature value of the LED light emitting device 1 falls within a range of 2586K-2859K and complies with the target of ANSI2700K-3000K, and the brightness ratio may be controlled to oscillate the overall color temperature of the LED light emitting device 1 in the predetermined straight line $L_1$.

Figure 8:
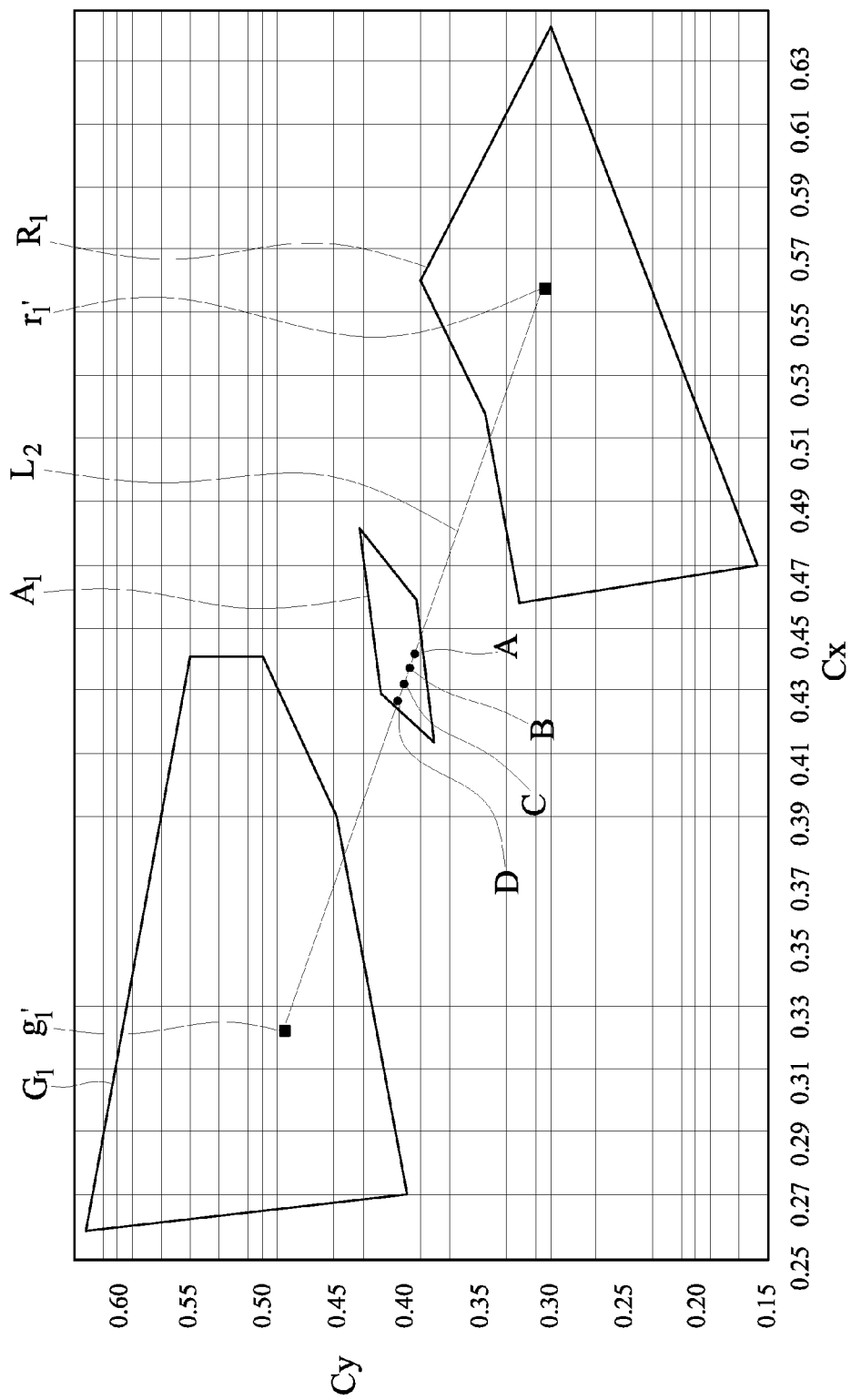
FIG. 8 shows the CIE1931 chromaticity coordinates of a second implementation mode of the present invention.

With reference to FIG. 8 for the CIE1931 chromaticity coordinates in accordance with the second implementation mode of the present invention, another predetermined straight line $L_2$ is selected according to the aforementioned conditions, and the end point $g_1'$ of the predetermined straight line $L_2$ corresponsive to the green light frame $G_1$ has the coordinates of (0.322,0.484), and the end point $r_1'$ corresponsive to the red light frame $R_1$ has the coordinates of (0.558,0.304), and the brightness ratio of the first LED 11 to the second LED 12 is set to 1.2-2.0 for the measurement, and the measured results are listed in Table 2.

TABLE 2

| Co-ordinate point | First LED brightness (lm) | Second LED brightness (lm) | Brightness ratio | Color temperature (K) | CIE1931 chromaticity coordinates |
|---|---|---|---|---|---|
| A | 120 | 100 | 1.2 | 2870 | (0.442, 0.399) |
| B | 150 | 100 | 1.5 | 2957 | (0.437, 0.401) |

TABLE 2-continued

| Co-ordinate point | First LED brightness (lm) | Second LED brightness (lm) | Brightness ratio | Color temperature (K) | CIE1931 chromaticity coordinates |
|---|---|---|---|---|---|
| C | 170 | 100 | 1.7 | 3076 | (0.433, 0.405) |
| D | 200 | 100 | 2.0 | 3219 | (0.426, 0.410) |

In Table 2, the measurements show that the overall color temperature of the LED light emitting device 1 forms four coordinate points A-D as listed in Table 2 under different brightness ratios, and A-D are disposed on the predetermined straight line $L_2$ in the color temperature target frame $A_1$, and the overall color temperature value of the LED light emitting device 1 falls within a range of 2870K-3219K and complies with the target of ANSI2700K-3000K, and the brightness ratio may be controlled to oscillate the overall color temperature of the LED light emitting device 1 in the predetermined straight line $L_2$.

Figure 9:
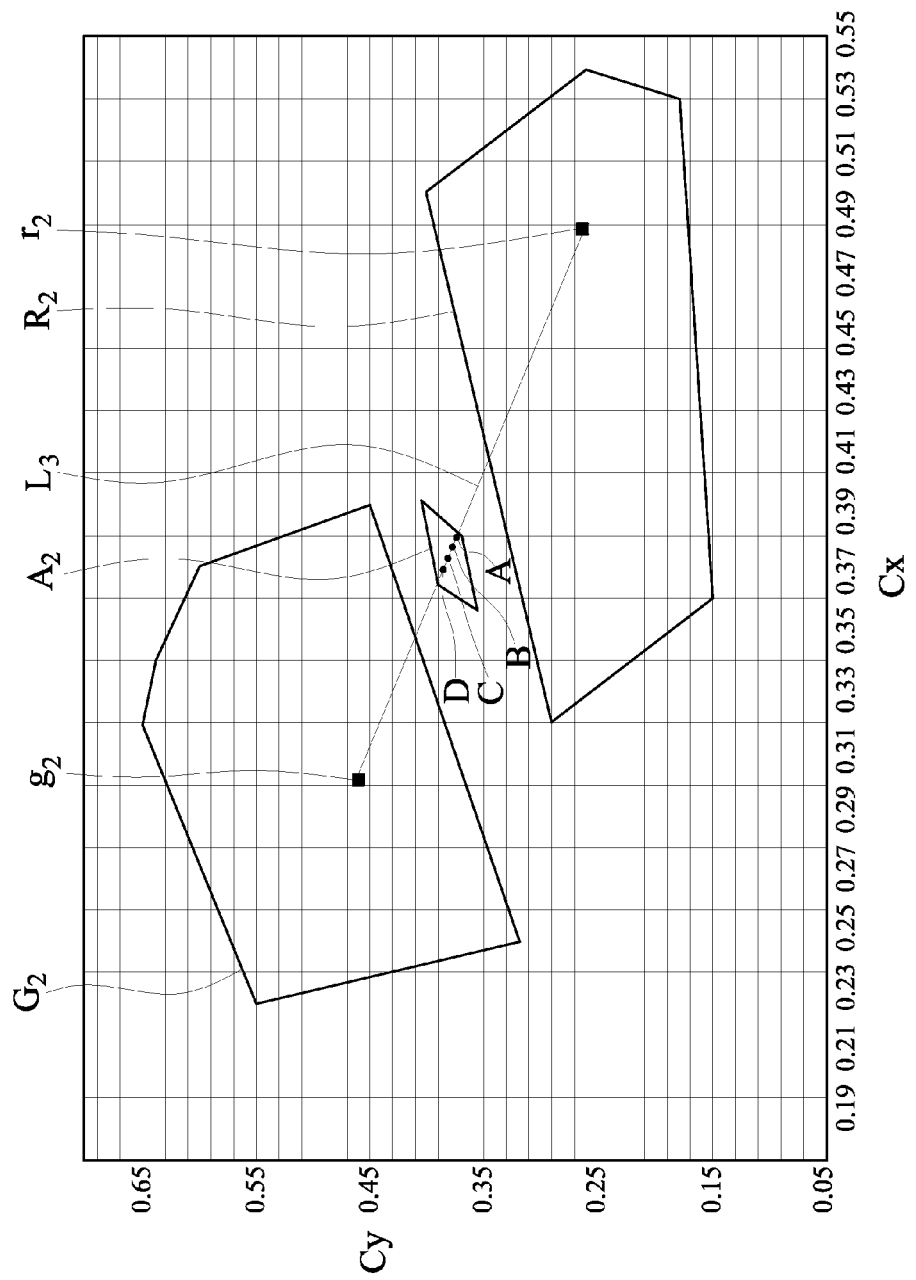
FIG. 9 shows the CIE1931 chromaticity coordinates of a third implementation mode of the present invention.

With reference to FIG. 9 for the CIE1931 chromaticity coordinates in accordance with the third implementation mode of the present invention, the specification of ANSI4100K refers to a color temperature falling within a range of 3710K-4260K, and when the target color temperature of the LED light emitting device 1 is ANSI4100K, the color temperature target frame $A_2$ has a range defined by the CIE chromaticity coordinates of (0.400,0.403), (0.374, 0.388), (0.367,0.358) and (0.390,0.371); the green light frame $G_2$ has a range defined by the CIE1931 chromaticity coordinates (0.37,0.42), (0.40,0.45), (0.38,0.60), (0.35, 0.64), (0.33,0.65), (0.24,0.55) and (0.26,0.32); and the red light frame $R_2$ has a range defined by the CIE1931 chromaticity coordinates (0.54,0.26), (0.53,0.18), (0.37,0.15), (0.33, 0.29) and (0.50,0.40). The predetermined straight line $L_3$ is selected, and the end point $g_2$ of the predetermined straight line $L_3$ corresponsive to the green light frame $G_2$ has the coordinates of (0.311,0.461), and end point $r_2$ corresponsive to the red light frame $R_2$ has the coordinates of (0.489, 0.264), and the brightness ratio of the first LED 11 to the second LED 12 is 2.2-3.2. With the aforementioned conditions, the LED light emitting device 1 is measured, and the measured results are listed in Table 3.

TABLE 3

| Co-ordinate point | First LED brightness (lm) | Second LED brightness (lm) | Brightness ratio | Color temperature (K) | CIE1931 chromaticity coordinates |
|---|---|---|---|---|---|
| A | 220 | 100 | 2.2 | 3711 | (0.391, 0.372) |
| B | 240 | 100 | 2.4 | 3844 | (0.387, 0.378) |
| C | 290 | 100 | 2.9 | 3980 | (0.383, 0.382) |
| D | 320 | 100 | 3.2 | 4104 | (0.379, 0.386) |

In Table 3, the measurements show that the overall color temperature of the LED light emitting device 1 forms four coordinate points A-D as listed in Table 3 under different brightness ratios, and A-D are disposed on the predetermined straight line $L_3$ in the color temperature target frame $A_2$, and the overall color temperature value of the LED light emitting device 1 falls within a range of 3711K-4104K and complies with the target of ANSI4100K, and the brightness ratio may be controlled to oscillate the overall color temperature of the LED light emitting device 1 in the predetermined straight line $L_3$.

Figure 10:
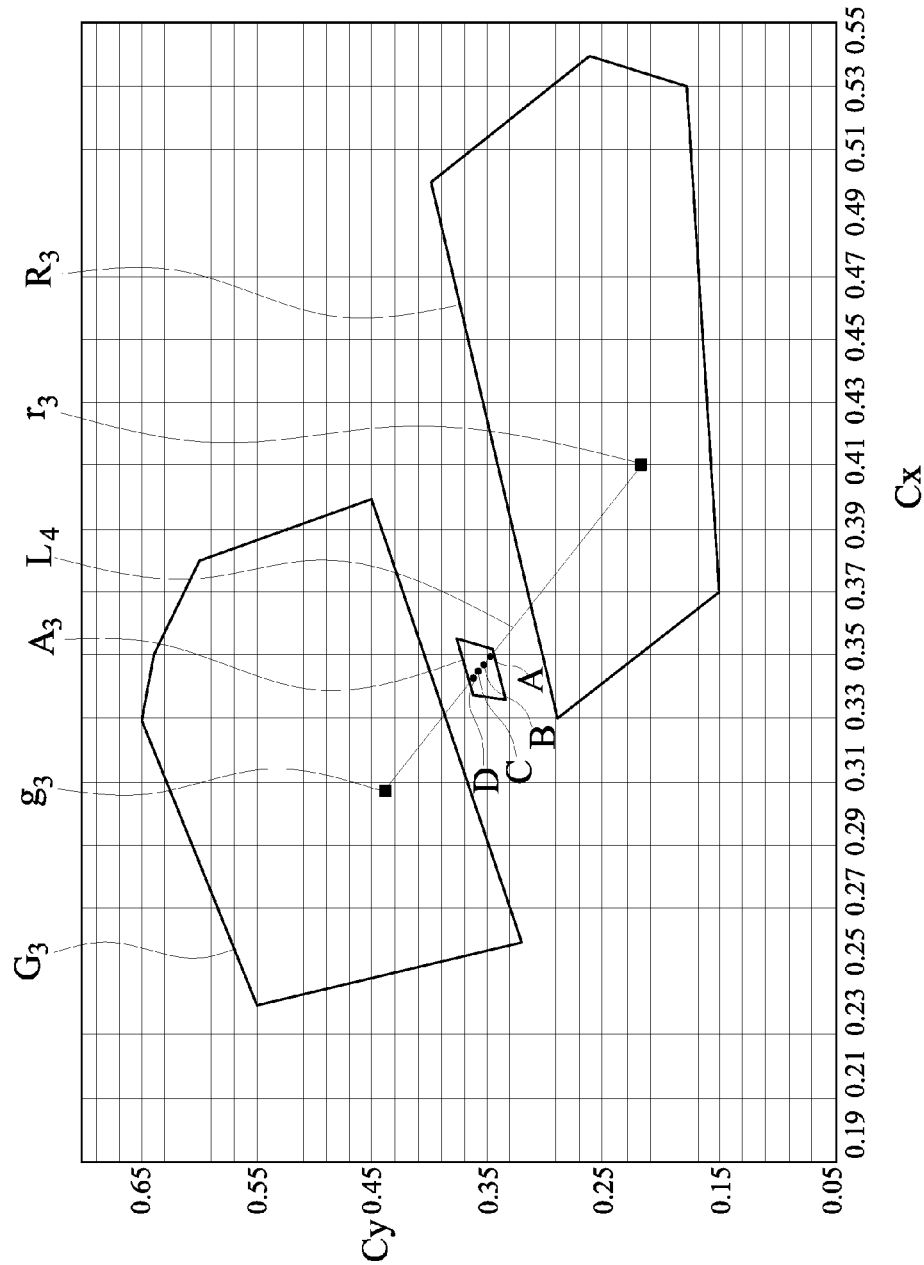
FIG. 10 shows the CIE1931 chromaticity coordinates of a fourth implementation mode of the present invention.

With reference to FIG. 10 for the CIE1931 chromaticity coordinates in accordance with the fourth implementation mode of the present invention, the specification of ANSI5000K refers to a color temperature falling within a range of 4746K-5312K, and when the target color temperature of the LED light emitting device 1 is ANSI5000K, the color temperature target frame $A_3$ has a range defined by the CIE1931 chromaticity coordinates of (0.355,0.375), (0.338, 0.362), (0.337,0.337) and (0.351,0.348); the green light frame $G_3$ has a range defined by the CIE1931 chromaticity coordinates (0.37,0.42), (0.40,0.45), (0.38,0.60), (0.35, 0.64), (0.33,0.65), (0.24,0.55) and (0.26,0.32), and the red light frame $R_3$ has a range defined by the CIE1931 chromaticity coordinates (0.54,0.26), (0.53,0.18), (0.37,0.15), (0.33, 0.29) and (0.50,0.40). The predetermined straight line $L_4$ is selected, and the end point $g_3$ of the predetermined straight line $L_4$ corresponsive to the green light frame $G_3$ has the coordinates of (0.307, 0.440), and the end point $r_3$ corresponsive to the red light frame $R_3$ has the coordinates of (0.411, 0.223), and the brightness ratio of the first LED 11 to the second LED 12 is 3.6-4.2. With the aforementioned conditions, the LED light emitting device 1 is measured and the measured results are listed in Table 4.

TABLE 4

| Co-ordinate point | First LED brightness (lm) | Second LED brightness (lm) | Brightness ratio | Color temperature (K) | CIE1931 chromaticity coordinates |
|---|---|---|---|---|---|
| A | 360 | 100 | 3.6 | 4817 | (0.349, 0.348) |
| B | 380 | 100 | 3.8 | 4918 | (0.348, 0.354) |
| C | 400 | 100 | 4.0 | 5028 | (0.345, 0.359) |
| D | 420 | 100 | 4.2 | 5122 | (0.343, 0.363) |

In Table 4, the measurements show that the overall color temperature of the LED light emitting device 1 forms four coordinate points A-D as listed in Table 4 under different brightness ratios, and A-D are disposed on the predetermined straight line $L_4$ in the color temperature target frame $A_3$, and the overall color temperature value of the LED light emitting device 1 falls within a range of 4817K-5122K and complies with the target of ANSI5000K, and the brightness ratio may be controlled to oscillate the overall color temperature of the LED light emitting device 1 in the predetermined straight line $L_4$.

Figure 11:
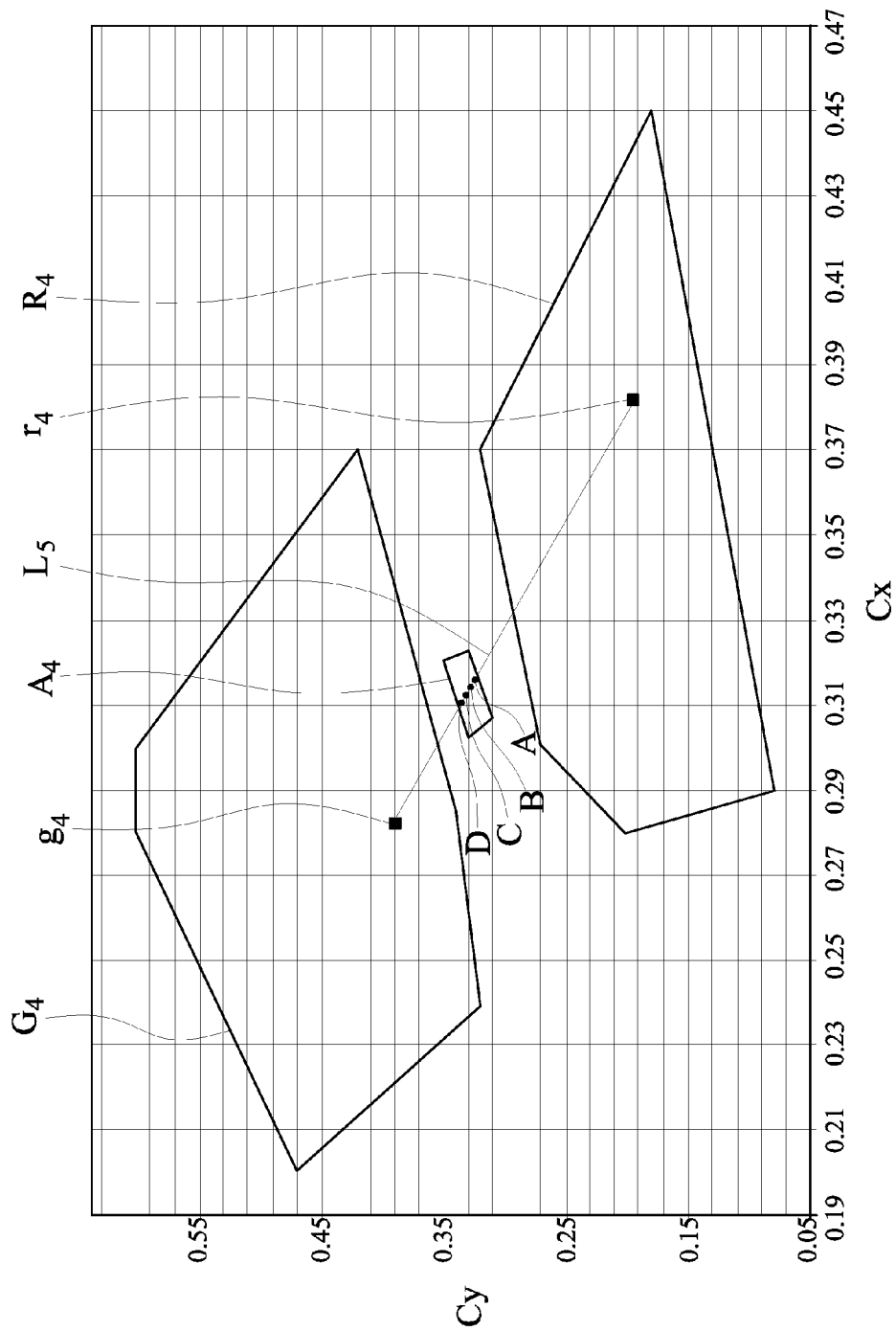
FIG. 11 shows the CIE1931 chromaticity coordinates of a fifth implementation mode of the present invention.

With reference to FIG. 11 for the CIE1931 chromaticity coordinates in accordance with the fifth implementation mode of the present invention, the specification of ANSI6500K refers to a color temperature falling within a range of 6022K-7042K, and when the target color temperature of the LED light emitting device 1 is ANSI6500K, the color temperature target frame $A_4$ has a range defined by the CIE chromaticity coordinates of (0.321,0.348), (0.303, 0.331), (0.307,0.312) and (0.322,0.325), and the green light frame $G_4$ has a range defined by the CIE1931 chromaticity coordinates (0.37,0.42), (0.30,0.60), (0.28,0.60), (0.27, 0.47), (0.24,0.32) and (0.285,0.34), and the red light frame $R_4$ has a range defined by the CIE1931 chromaticity coordinates (0.37,0.32), (0.45,0.18), (0.29,0.08), (0.28,0.20) and (0.30,0.27). The predetermined straight line $L_5$ is selected, and the end point $g_4$ of the predetermined straight line $L_5$ corresponsive to the green light frame $G_4$ has the coordinates of (0.282,0.390), and the end point $r_4$ corresponsive to the red light frame $R_4$ has the coordinates of (0.382,0.195), and the brightness ratio of the first LED 11 to the second LED 12 is 3.6-4.2. With the aforementioned conditions, the LED light emitting device 1 is measured, and the measured results are listed in Table 5.

TABLE 5

| co-ordinate point | first LED brightness (lm) | second LED brightness (lm) | brightness ratio | color temperature (K) | CIE1931 chromaticity coordinates |
|---|---|---|---|---|---|
| A | 360 | 100 | 3.6 | 6323 | (0.317, 0.321) |
| B | 380 | 100 | 3.8 | 6408 | (0.315, 0.325) |
| C | 400 | 100 | 4.0 | 6515 | (0.313, 0.329) |
| D | 420 | 100 | 4.2 | 6610 | (0.310, 0.334) |

In Table 5, the measurements show that the overall color temperature of the LED light emitting device 1 forms four coordinate points A-D as listed in Table 5 under different brightness ratios, and A-D are disposed on the predetermined straight line $L_5$ in the color temperature target frame $A_4$, and the overall color temperature value of the LED light emitting device 1 falls within a range of 6323K-6610K and complies with the target of ANSI6500K, and the brightness ratio may be controlled to oscillate the overall color temperature of the LED light emitting device 1 in the predetermined straight line $L_5$.

The results of the LED light emitting device 1 measured under the predetermined conditions show that the overall color temperature of the LED light emitting device 1 complies with the color temperature target frame, and the color temperature of the LED light emitting device 1 may be fine tuned by adjusting the brightness ratio to comply with the color temperature target frame, so that the LED light emitting device manufacturing method and the LED light emitting device 1 can improve the degree of freedom for adjustment.

In summation of the description above, the present invention discloses an LED light emitting device manufacturing method and an LED light emitting device capable of adjusting the color temperature easily, improving the degree of freedom for dimming, and providing better light emission efficiency. The inventor of the present invention breaks through the conventional way and adopts an LED other than a white light source to express the color temperature of the white light of the LED light emitting device by mixing different color lights, so as to overcome the problem of non-uniform color temperature. Regardless of the configuration of the first LED and the second LED on the substrate, the white light can be adjusted to a uniform one, and any specific block will not be affected by the green light of the first LED or the red light of the second LED or have any deviation of color temperature and also provides an excellent light emission efficiency. In addition, the quantity of the first LEDs and the second LEDs may be changed to adjust the brightness ratio, so that the overall color temperature of the LED light emitting device may be fine tuned to comply with the target color temperature, so as to improve the optical quality of the LED light emitting device and provide a better color temperature.

What is claimed is:

1. A manufacturing method of an LED light emitting device capable of adjusting color temperature easily, provided for expressing at least one color temperature within a color temperature target frame and in compliance with the CIE1931 chromaticity coordinates specified by ANSI, comprising the steps of:

selecting a first blue LED chip and a second blue LED chip having a same specification;

using a green phosphor together with the first blue LED chip to determine a green light frame in the CIE1931 chromaticity coordinates;

using a red phosphor together with the second blue LED chip to determine a red light frame in the CIE1931 chromaticity coordinates;

selecting a predetermined straight line passing through the color temperature target frame, and one end point of the predetermined straight line falling within the green light frame and an another end point of the predetermined straight line falling within the red light frame, so as to determine a concentration of the green phosphor and a concentration of the red phosphor; wherein the green phosphor and the first blue LED chip are packaged into an integrally formed first LED, and the red phosphor and the second blue LED chip are packaged into an integrally formed second LED, and at least one first LED and at least one second LED are installed on a substrate, and using a quantity of the first LEDs and a quantity of the second LEDs to adjust a brightness ratio of the first LED to the second LED, so that the overall color temperature of the LED light emitting device oscillates in the predetermined straight line in the color temperature target frame, wherein the first and the second blue LED chip have a wavelength of 400 nm-480 nm, and the red phosphor emits a red light having wavelength of 600 nm-650 nm after being excited, and the green phosphor emits a green light having wavelength of 515 nm-560 nm after being excited, wherein the color temperature target frame has a range defined by the CIE1931 chromaticity coordinates (0.481,0.431), (0.459,0.394), (0.430,0.417) and (0.415, 0.382); the green light frame has a range defined by the CIE1931 chromaticity coordinates (0.44,0.50), (0.44,0.55), (0.26,0.62), (0.27,0.40) and (0.39,0.45); and the red light frame has a range defined by the CIE1931 chromaticity coordinates (0.52,0.35), (0.56,0.39), (0.64,0.30), (0.47,0.16) and (0.46,0.32), wherein the brightness ratio of the first LED to the second LED is 1.2-2.0.

2. A manufacturing method of an LED light emitting device capable of adjusting color temperature easily, provided for expressing at least one color temperature within a color temperature target frame and in compliance with the CIE1931 chromaticity coordinates specified by ANSI, comprising the steps of:

selecting a first blue LED chip and a second blue LED chip having a same specification;

using a green phosphor together with the first blue LED chip to determine a green light frame in the CIE1931 chromaticity coordinates;

using a red phosphor together with the second blue LED chip to determine a red light frame in the CIE1931 chromaticity coordinates;

selecting a predetermined straight line passing through the color temperature target frame, and one end point of the predetermined straight line falling within the green light frame and an another end point of the predetermined straight line falling within the red light frame, so as to determine a concentration of the green phosphor and a concentration of the red phosphor; wherein the green phosphor and the first blue LED chip are packaged into an integrally formed first LED, and the red phosphor and the second blue LED chip are packaged into an integrally formed second LED, and at least one first LED and at least one second LED are installed on a substrate, and using a quantity of the first LEDs and a quantity of die second LEDs to adjust a brightness ratio of the first LED to the second LED, so that the overall color temperature of the LED light emitting device oscillates in the predetermined straight line in the color temperature target frame, wherein the first and the second blue LED chip have a wavelength of 400 nm-480 nm, and the red phosphor emits a red light having wavelength of 600 nm-650 nm after being excited, and the green phosphor emits a green light having wavelength of 515 nm-560 nm after being excited, wherein the color temperature target frame has a range defined by the CIE1931 chromaticity coordinates (0.481,0.431), (0.459,0.394), (0.430,0.417) and (0.415.0.382); the green light frame has a range defined by the CIE1931 chromaticity coordinates (0.44,0.50), (0.44,0.55), (0.26,0.62), (0.27,0.40) and (0.39.0.45); and the red light frame has a range defined by the CIE1931 chromaticity coordinates (0.52,0.35), (0.56, 0.39), (0.64,0.30), (0.47,0.16) and (0.46,0.32), wherein the brightness ratio of the first LED to the second LED is 2.2-3.2.

3. A manufacturing method of an LED light emitting device capable of adjusting color temperature easily, provided for expressing at least one color temperature within a color temperature target frame and in compliance with the CIE1931 chromaticity coordinates specified by ANSI, comprising the steps of:

selecting a first blue LED chip and a second blue LED chip having a same specification;

using a green phosphor together with the first blue LED chip to determine a green light frame in the CIE1931 chromaticity coordinates;

using a red phosphor together with the second blue LED chip to determine a red light frame in the CIE1931 chromaticity coordinates;

selecting a predetermined straight line passing through the color temperature target frame, and one end point of the predetermined straight line falling within the green light frame and an another end point of the predetermined straight line falling within the red light frame, so as to determine a concentration of the green phosphor and a concentration of the red phosphor; wherein the green phosphor and the first blue LED chip are packaged into an integrally formed first LED, and the red phosphor and the second blue LED chip are packaged into an integrally formed second LED, and at least one first LED and at least one second LED are installed on a substrate, and using a quantity of the first LEDs and a quantity of die second LEDs to adjust a brightness ratio of the first LED to the second LED, so that the overall color temperature of the LED light emitting device oscillates in the predetermined straight line in the color temperature target frame, wherein the first and the second blue LED chip have a wavelength of 400 nm-480 nm, and the red phosphor emits a red light having wavelength of 600 nm-650 nm after being excited, and the green phosphor emits a green light having wavelength of 515 nm-560 nm after being excited, wherein the color temperature target frame has a range defined by the CIE1931 chromaticity coordinates (0.481,0.431), (0.459,0.394), (0.430,0.417) and (0.415.0.382); the green light frame has a range defined by the CIE1931 chromaticity coordinates (0.44,0.50), (0.44,0.55), (0.26,0.62), (0.27,0.40) and (0.39.0.45); and the red light frame has a range defined by the CIE1931 chromaticity coordinates (0.52,0.35), (0.56, 0.39), (0.64,0.30), (0.47,0.16) and (0.46,0.32), wherein the brightness ratio of the first LED to the second LED is 3.6-4.2.

* * * * *